(12) United States Patent
Iguchi et al.

(10) Patent No.: US 10,727,209 B2
(45) Date of Patent: Jul. 28, 2020

(54) SEMICONDUCTOR DEVICE AND SEMICONDUCTOR ELEMENT WITH IMPROVED YIELD

(71) Applicant: KABUSHIKI KAISHA TOSHIBA, Minato-ku (JP)

(72) Inventors: Tomohiro Iguchi, Kawasaki (JP); Akiya Kimura, Yokohama (JP); Akihiro Sasaki, Shinagawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/984,481

(22) Filed: May 21, 2018

(65) Prior Publication Data
US 2019/0035770 A1    Jan. 31, 2019

(30) Foreign Application Priority Data
Jul. 25, 2017    (JP) .................................. 2017-143553

(51) Int. Cl.
*H01L 25/07*    (2006.01)
*H01L 23/31*    (2006.01)
(Continued)

(52) U.S. Cl.
CPC ............ *H01L 25/072* (2013.01); *H01L 23/04* (2013.01); *H01L 23/24* (2013.01);
(Continued)

(58) Field of Classification Search
CPC ... H01L 23/3157–3192; H01L 23/3135; H01L 23/5386; H01L 23/5389;
(Continued)

(56) References Cited

U.S. PATENT DOCUMENTS

2007/0152318 A1*    7/2007    Chiang ............... H01L 23/3121
                                              257/687
2010/0238627 A1    9/2010    Shinohara
(Continued)

FOREIGN PATENT DOCUMENTS

JP    2010-225720    10/2010
JP    2011-77464    4/2011
(Continued)

*Primary Examiner* — Laura M Menz
*Assistant Examiner* — Candice Chan
(74) *Attorney, Agent, or Firm* — Oblon, McClelland, Maier & Neustadt, L.L.P.

(57) ABSTRACT

According to one embodiment, a semiconductor device includes a first semiconductor element, a first element insulating part, and an insulating sealing member. The first semiconductor element includes a first semiconductor chip and a first chip electrode electrically connected to the first semiconductor chip. The first semiconductor chip has a first surface crossing a first direction, a second surface crossing the first direction and distant from the first surface, and a third surface between the first and second surfaces. The first chip electrode is disposed on the first surface. The first element insulating part includes a first portion and a second portion continuous to the first portion. The insulating sealing member includes a third portion and a fourth portion continuous to the third portion. The first portion is between the first surface and the third portion, and the second portion is between the third surface and the fourth portion.

6 Claims, 17 Drawing Sheets

(51) Int. Cl.
*H01L 23/538* (2006.01)
*H01L 23/00* (2006.01)
*H01L 23/04* (2006.01)
*H01L 23/367* (2006.01)
*H01L 25/18* (2006.01)
*H01L 23/24* (2006.01)
*H01L 23/498* (2006.01)
*H01L 21/66* (2006.01)
*H01L 23/373* (2006.01)

(52) U.S. Cl.
CPC ...... *H01L 23/3121* (2013.01); *H01L 23/3675* (2013.01); *H01L 23/5386* (2013.01); *H01L 24/05* (2013.01); *H01L 24/32* (2013.01); *H01L 24/48* (2013.01); *H01L 24/73* (2013.01); *H01L 25/18* (2013.01); *H01L 22/32* (2013.01); *H01L 23/3135* (2013.01); *H01L 23/3735* (2013.01); *H01L 23/49811* (2013.01); *H01L 23/49866* (2013.01); *H01L 24/03* (2013.01); *H01L 24/06* (2013.01); *H01L 2224/0345* (2013.01); *H01L 2224/04042* (2013.01); *H01L 2224/05016* (2013.01); *H01L 2224/0603* (2013.01); *H01L 2224/32225* (2013.01); *H01L 2224/48091* (2013.01); *H01L 2224/48106* (2013.01); *H01L 2224/48227* (2013.01); *H01L 2224/73265* (2013.01); *H01L 2924/00014* (2013.01); *H01L 2924/10272* (2013.01); *H01L 2924/1203* (2013.01); *H01L 2924/13055* (2013.01); *H01L 2924/13091* (2013.01)

(58) Field of Classification Search
CPC ....... H01L 25/072; H01L 24/05; H01L 25/18; H01L 23/3675; H01L 24/73; H01L 24/32; H01L 23/04; H01L 24/48; H01L 23/3121; H01L 24/06; H01L 22/32; H01L 24/03; H01L 2224/0345; H01L 2924/10272; H01L 2924/1203; H01L 2924/13091; H01L 2924/13055; H01L 2224/73265; H01L 2224/32225; H01L 2224/48227; H01L 2224/48106; H01L 2224/48091; H01L 2224/0603; H01L 2224/05016; H01L 23/49811; H01L 2224/04042; H01L 23/24; H01L 2924/00014; H01L 23/49866; H01L 23/3735

See application file for complete search history.

(56) References Cited

U.S. PATENT DOCUMENTS

| | | | |
|---|---|---|---|
| 2012/0300522 | A1 | 11/2012 | Tokuyama et al. |
| 2015/0108661 | A1* | 4/2015 | Vincent .................. H01L 24/30 257/777 |
| 2018/0082933 | A1* | 3/2018 | Ko .................... H01L 23/49816 |

FOREIGN PATENT DOCUMENTS

| | | |
|---|---|---|
| JP | 2013-16525 | 1/2013 |
| JP | 2014-47362 | 3/2014 |

* cited by examiner

SEMICONDUCTOR DEVICE AND SEMICONDUCTOR ELEMENT WITH IMPROVED YIELD

CROSS-REFERENCE TO RELATED APPLICATIONS

This application is based upon and claims the benefit of priority from Japanese Patent Application No. 2017-143553, filed on Jul. 25, 2017; the entire contents of which are incorporated herein by reference.

FIELD

Embodiments described herein relate to a semiconductor device and a semiconductor element.

BACKGROUND

There has been a power semiconductor module mounting multiple power semiconductor elements in one case member as one of semiconductor devices. Improvement of yield of such a semiconductor device has been desired.

DETAILED DESCRIPTION

Figure 1:
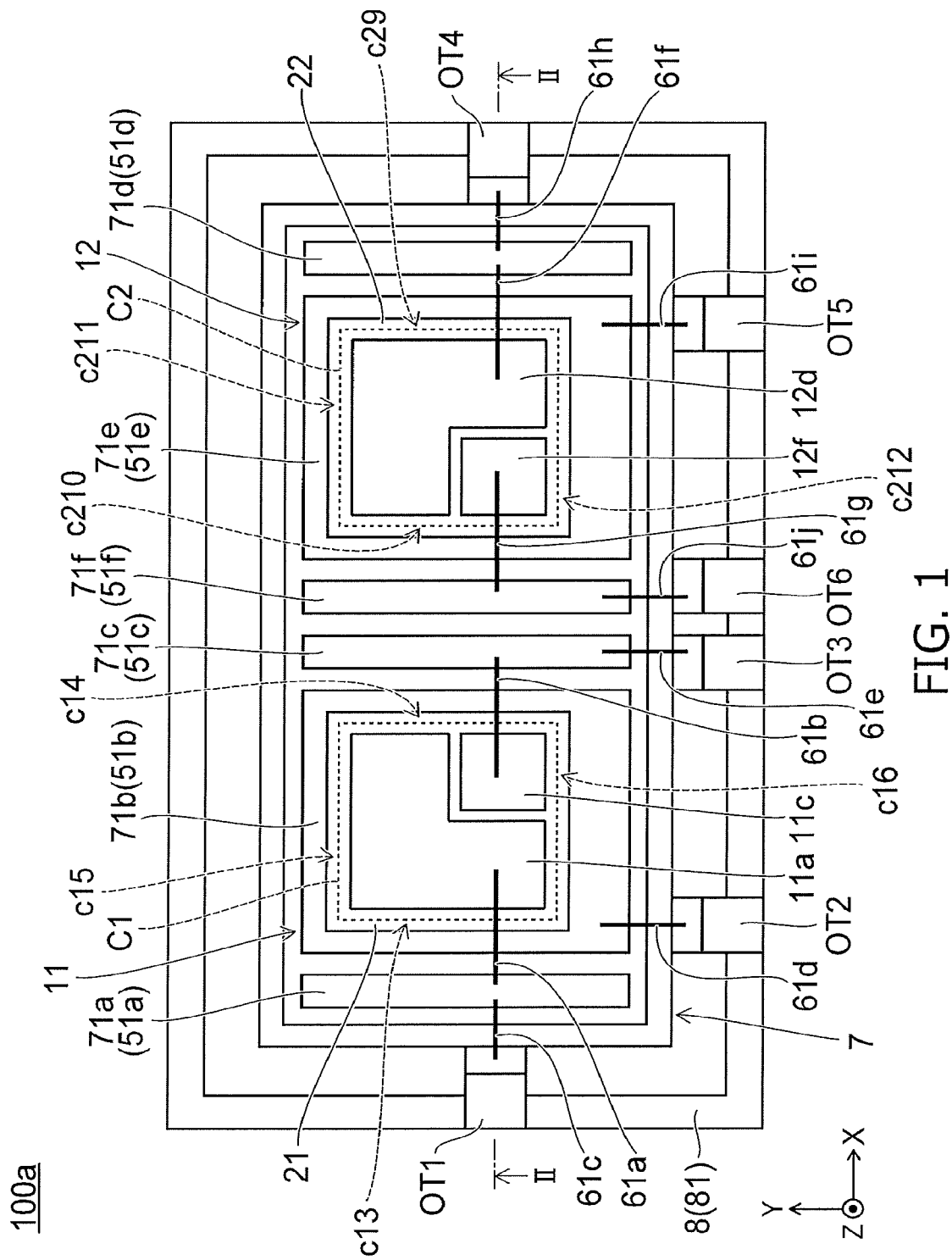
FIG. 1 is a schematic plan view illustrating a semiconductor device according to a first embodiment.

According to one embodiment, a semiconductor device includes a first semiconductor element, a first element insulating part, and an insulating sealing member. The first semiconductor element includes a first semiconductor chip and a first chip electrode electrically connected to the first semiconductor chip. The first semiconductor chip has a first surface crossing a first direction, a second surface crossing the first direction and distant from the first surface, and a third surface positioned between the first surface and the second surface. The first chip electrode is disposed on the first surface. The first element insulating part includes a first portion and a second portion continuous to the first portion. The insulating sealing member includes a third portion and a fourth portion continuous to the third portion. The first portion is positioned between the first surface and the third portion, and the second portion is positioned between the third surface and the fourth portion.

According to another embodiment, a semiconductor element includes a first semiconductor chip, a second semiconductor chip, a first extraction electrode, a second extraction electrode, a first chip electrode, a fourth chip electrode, a second chip electrode, a fifth chip electrode, and a first element insulating part. The first semiconductor chip has a first surface crossing a first direction, a second surface crossing the first direction and distant from the first surface, and a third surface positioned between the first surface and the second surface. The second semiconductor chip has a seventh surface crossing the first direction, an eighth surface crossing the first direction and distant from the seventh surface, and a ninth surface positioned between the seventh surface and the eighth surface. The first extraction electrode includes a surface along a direction crossing the first surface, and a surface along a direction crossing the seventh surface. The first chip electrode is disposed on the first surface, positioned between the first surface and the first extraction electrode, and electrically connected to the first semiconductor chip and the first extraction electrode. The fourth chip electrode is disposed on the seventh surface, positioned between the seventh surface and the first extraction electrode, and electrically connected to the second semiconductor chip and the first extraction electrode. The second chip electrode is disposed on the second surface, positioned between the second surface and the second extraction electrode, and electrically connected to the first semiconductor chip and the second extraction electrode. The fifth chip electrode is disposed on the eighth surface, positioned between the eighth surface and the second extraction electrode, and electrically connected to the second semiconductor chip and the second extraction electrode. The first element insulting part includes a first portion, a second portion, a fifth portion, a sixth portion, a seventh portion and an eighth portion. The first portion is positioned between the first surface and the first extraction electrode. The second portion is continuous to the first portion along the third surface. The fifth portion is continuous to the first portion, and contacts a surface along a direction crossing the first surface of the first extraction electrode. The sixth portion is positioned between the seventh surface and the first extraction electrode. The seventh portion is continuous to the sixth portion along the eighth surface. The eighth surface is continuous to the sixth portion, and contacts a surface along a direction crossing the seventh surface of the first extraction electrode.

Various embodiments will be described hereinafter with reference to the accompanying drawings.

The drawings are schematic and conceptual; and the relationships between the thickness and width of portions, the proportions of sizes among portions, etc., are not necessarily the same as the actual values thereof. Further, the dimensions and proportions may be illustrated differently among drawings, even for identical portions.

In the specification and drawings, components similar to those described or illustrated in a drawing thereinabove are marked with like reference numerals, and a detailed description is omitted as appropriate.

(First Embodiment)

Figure 2:
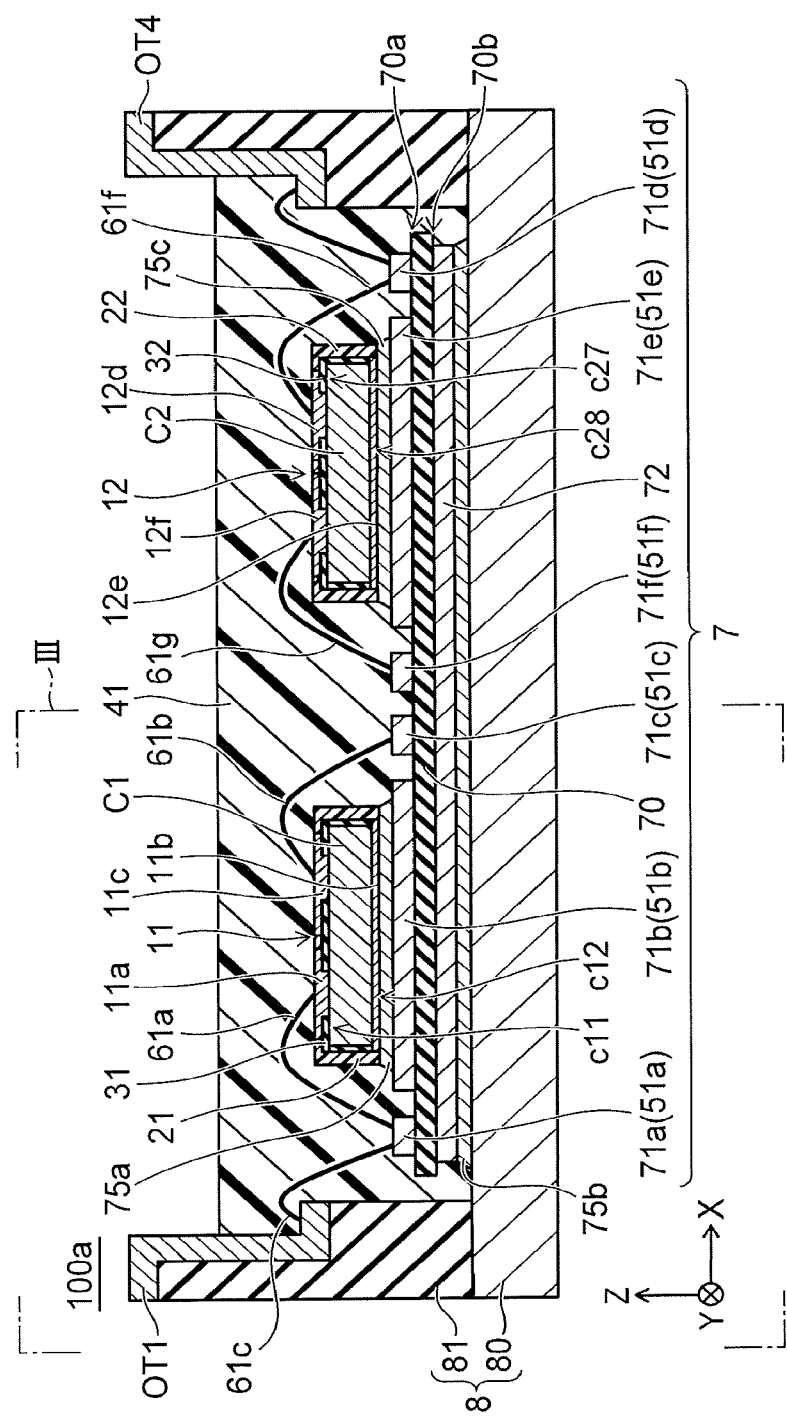
FIG. 2 is a schematic cross-sectional view along II-II line in FIG. 1.
Figure 3:
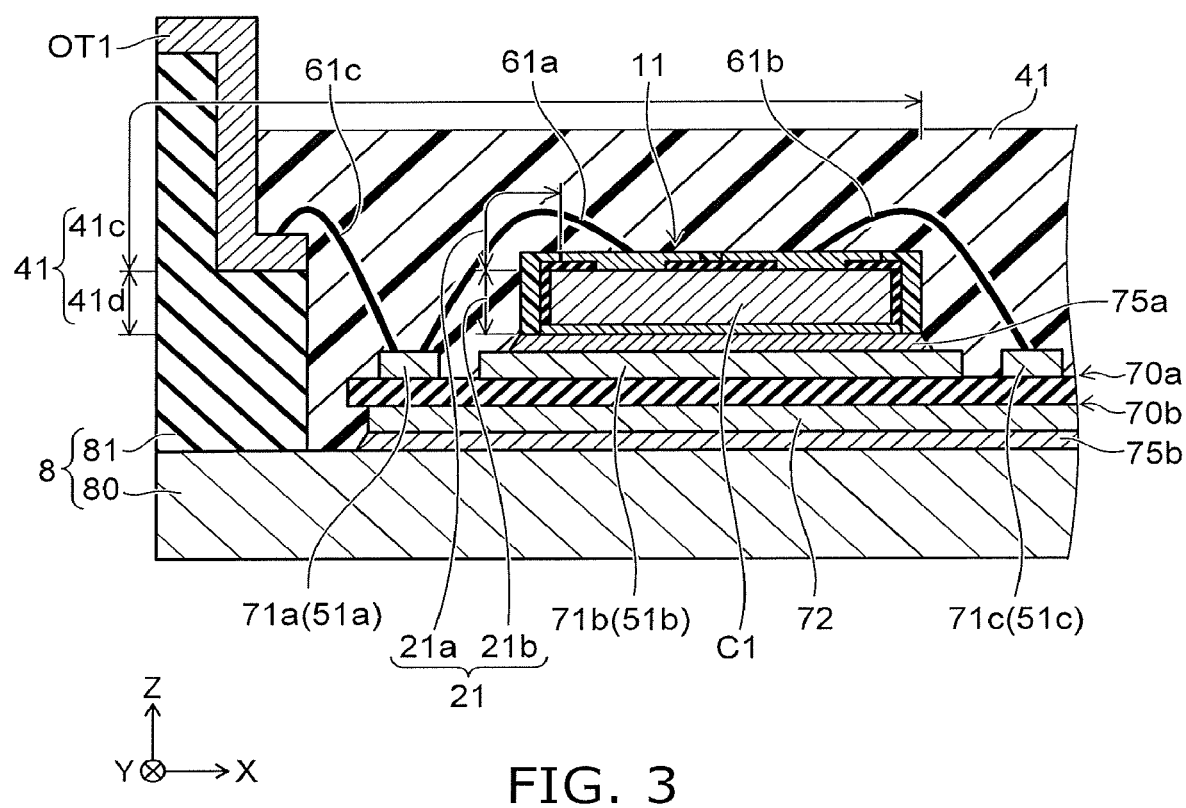
FIG. 3 is a schematic cross-sectional view enlarging the inside of the frame III in FIG. 2.
Figure 4:
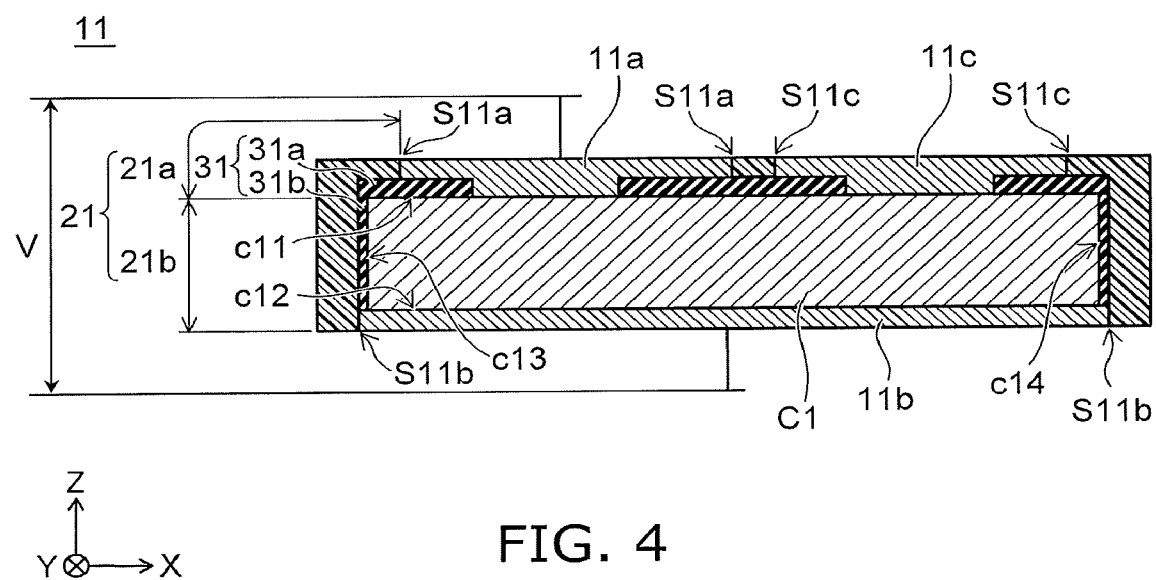
FIG. 4 is a schematic cross-sectional view enlarging a first semiconductor element.

FIG. 1 is a schematic plan view illustrating a semiconductor device according to a first embodiment. FIG. 2 is a schematic cross-sectional view along II-II line in FIG. 1. FIG. 3 is a schematic cross-sectional view enlarging the inside of the frame III in FIG. 2. FIG. 4 is a schematic cross-sectional view enlarging a first semiconductor element.

FIG. 1 shows a first direction, a second direction, and a third direction. In the specification, the first direction is taken as a Z-axis direction. One direction crossing the Z-axis direction, for example, orthogonal to the Z-axis direction is taken as the second direction. The second direction is an X-axis direction. One direction crossing each of the X-axis direction and the Z-axis direction, for example, orthogonal to each of the X-axis direction and the Z-axis direction is taken as the third direction. The third direction is a Y-axis direction. The third direction crosses a plane (a plane including the first direction and the second direction) formed of the first direction and the second direction.

As shown in FIG. 1 to FIG. 3, a semiconductor device 100a according to the first embodiment includes a semiconductor element 11, a first element insulating part 21, an insulating sealing member 41, first to third terminal electrodes 51a to 51c, first to fifth wiring members 61a to 61e, a wiring substrate 7, and a case member 8.

The semiconductor element 11 includes a first semiconductor chip C1. The semiconductor chip C1 is, for example, a power semiconductor element. In the first embodiment, the power semiconductor element is, for example, IGBT (Integrated Gate Bipolar Transistor). The first semiconductor chip C1 has a first surface c11 crossing the Z-axis direction, a second surface c12 crossing the Z-axis direction and distant from the first surface c11, and third to sixth surfaces c13 to c16 positioned between the first surface c11 and the second surface c12. The first surface c11 and the second surface c12 are a surface and a back side, respectively, the third to sixth surfaces c13 to c16 are side surfaces, respectively. The first semiconductor chip C1 includes first to third chip electrodes 11a to 11c. The first chip electrode 11a is disposed on the first surface c11. The first chip electrode 11a is, for example, an emitter electrode of IGBT, and electrically connected to an emitter region of the first semiconductor chip C1. The second chip electrode 11b is disposed on the second surface c12. The second chip electrode 11b is, for example, a collector electrode of IGBT, and electrically connected to a collector region of the first semiconductor chip C1. The third chip electrode 11c is disposed on the first surface c11. The third chip electrode 11c is, for example, a gate electrode of IGBT, and electrically connected to a gate region of the first semiconductor chip C1. The first semiconductor chip C1 is, for example, a semiconductor chip including a public-known IGBT. In the drawing, the emitter region, the collector region, and the gate region are omitted. The power semiconductor element is not limited to IGBT. The power semiconductor element may be a power MOSFET or a diode.

The first element insulating part 21 includes a first portion 21a and a second portion 21b (see FIG. 4). The first portion 21a is, for example, disposed on the first surface c11. The second portion 21b is, for example, disposed on the third surface c13. The second portion 21b is continuous to the first portion 21a. The first element insulating part 21 is, for example, an insulating package member. The insulating package member covers the first semiconductor chip C1 except, for example, electrical connection points of the first to third chip electrodes 11a to 11c. The electrical connection points are, for example, points where wire bonding is made. The insulating package member includes, for example, an insulative epoxy resin or an insulative polyimide resin. The first element insulating part 21 electrically insulates the first chip electrode 11a from the second chip electrode 11b. Furthermore, the first element insulating part 21 electrically insulates the third chip electrode 11c from the second chip electrode 11b. Furthermore, the first element insulating part 21 electrically insulates the first chip electrode 11a from the third chip electrode 11c.

In the first embodiment, the first semiconductor chip C1 includes, for example, a first chip insulating part 31. The first chip insulating part 31 has a first insulating region 31a and a second insulating region 31b (see FIG. 4). The first insulating region 31a is positioned, for example, between the first surface c11 and the first portion 21a. The first insulating region 31a is, for example, an interlayer insulating film provided on the first surface c11. The interlayer insulating film includes, for example, a silicon oxide. The first insulating region 31a contacts the first portion 21a. The first chip electrode 11a and the third chip electrode 11c may include a portion positioned on the first insulating region 31a. In such a case, the first chip electrode 11a has a surface S11a crossing the X-axis direction, for example, orthogonal to the X-axis direction on the first insulating region 31a. The third chip electrode 11c also has a surface S11c crossing the X-axis direction, for example, orthogonal to the X-axis direction on the first insulating region 31a. The second chip electrode 11b has a surface S11b crossing the X-axis direction, for example, orthogonal to the X-axis direction on the second insulating region 31b. The first element insulating part 21 contacts the surface S11a, the surface S11b, and surface S11c.

The second insulating region 31b is positioned, for example, between the third to sixth surfaces c13 to c16 and the second portion 21b (see FIG. 4). The second insulating region 31b is, for example, an oxide film (for example, a film including a silicon oxide) of naturally oxidized third to sixth surfaces c13 to c16, or an insulating film provided on the third to sixth surfaces c13 to c16. The second insulating region 31b contacts the first portion 21b.

The insulating sealing member 41 includes a third portion 41c and a fourth portion 41d which is continuous to the third portion 41c (see FIG. 3). In the Z-axis direction, the first portion 21a of the first element insulating part 21 is positioned between the first surface 11c and the third portion 41c. The second portion 21b of the first element insulating part 21 is positioned in the X-axis direction between the third surface 11c and the fourth portion 41d. The insulating sealing member 41 is different from the first element insulating part 21 and includes an insulative silicone resin, for example.

The wiring substrate 7 includes an insulating substrate part 70, first to third substrate electrodes 71a to 71c, and a back side metal part 72 (see FIG. 2). The insulating substrate part 70 includes, for example, an insulative ceramic. The insulating substrate part 70 has a major surface 70a and a back side 70b. The major surface 70a and the back side 70b are distant in the Z-axis direction, and cross the Z-axis direction, for example, orthogonal to the Z-axis direction. The first to third substrate electrodes 71a to 71c are positioned, for example, on the major surface 70a. The first to third substrate electrodes 71a to 71c are conductive wirings provided on the major surface 70a. The first to third substrate electrodes 71a to 71c include, for example, copper (Cu). In the first embodiment, the first to third substrate electrodes 71a to 71c are, for example, first to third terminal electrodes 51a to 51c. The back side metal part 72 is positioned, for example, on the back side 70b. The back side metal part 72 includes, for example, Cu.

The second substrate electrode 71b (second terminal electrode 51b) is electrically connected to the second chip electrode 11b, for example, via a conductive first joining member 75a. The first joining member 75a is, for example, a solder. The first joining member 75a is electrically connected to the second chip electrode 11b and the second terminal electrode 51b.

The first wiring member 61a electrically connects the first chip electrode 11a to the first substrate electrode 71a (first terminal electrode 51a). The second wiring member 61b electrically connects the third chip electrode 11c to the third substrate electrode 71c (third terminal electrode 51c). The first wiring member 61a and the second wiring member 61b pass through the insulating sealing member 41. For example, the first wiring member 61a and the second wiring member 61b are a bonding wire, respectively.

The case member 8 includes, for example, a base part 80 and an insulating part 81. A heat dissipating material is selected for the base part 80, for example. The base part 80 is, for example, a metal. The metal includes, for example, Cu. The base part 80 is joined to the back side metal part 72, for example, via a second joining member 75b. The second joining member 75b is, for example, a solder. An insulative resin is selected for the insulating part 81, for example. The resin includes, for example, an insulative epoxy resin or an insulative polyimide resin.

The insulating part 81 includes first to third external terminals OT1 to OT3. The third wiring member 61c electrically connects the first substrate electrode 71a (first terminal electrode 51a) to the first external terminal OT1. The fourth wiring member 61d electrically connects the second substrate electrode 71b (second terminal electrode 51b) to the second external terminal OT2. The fifth wiring member 61e electrically connects the third substrate electrode 71c (third terminal electrode 51c) to the third external terminal OT3. The third to fifth wiring members 61c to 61e pass through the insulating sealing member 41. For example, the third to fifth wiring members 61c to 61e are a bonding wire, respectively.

The first external terminal OT1 is also possible to be electrically connected to the first chip electrode 11a by a wiring member such as a bonding wire, for example. In such a case, the first external terminal OT1 serves as the first terminal electrode 51a. Similarly, the third external terminal OT3 is also possible to be electrically connected to the third chip electrode 11c by a wiring member such as a bonding wire, for example. In such a case, the third external terminal OT3 serves as the third terminal electrode 51c.

The first semiconductor element 11 is covered with the first element insulating part 21, for example, except the electrical connection points, for example, of the first to third chip electrodes 11a to 11c. In this state, the first semiconductor element 11 is mounted in the case member 8, and sealed by the insulating sealing member 41.

Figure 5A:
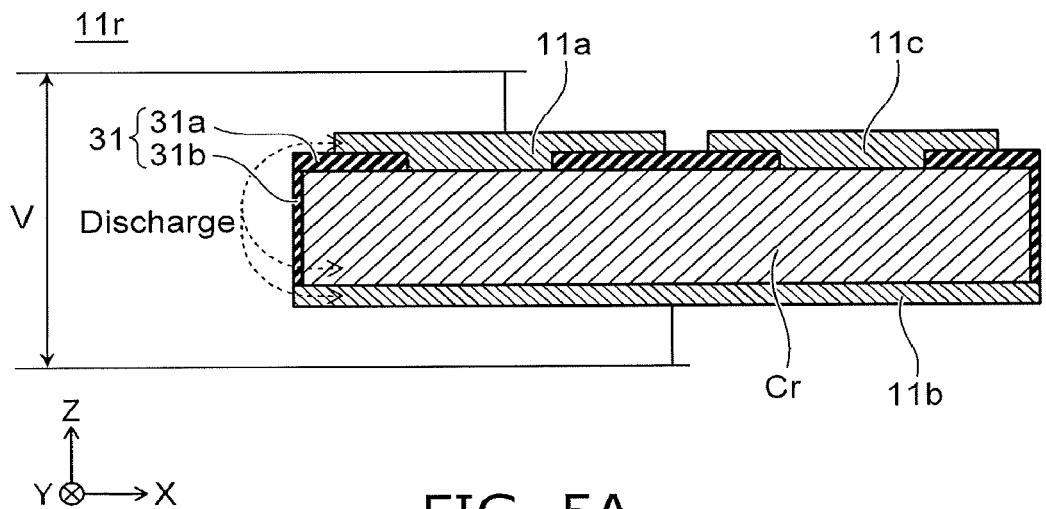
FIG. 5A and FIG. 5B are schematic cross-sectional views illustrating a semiconductor device according to a reference example.
Figure 5B:
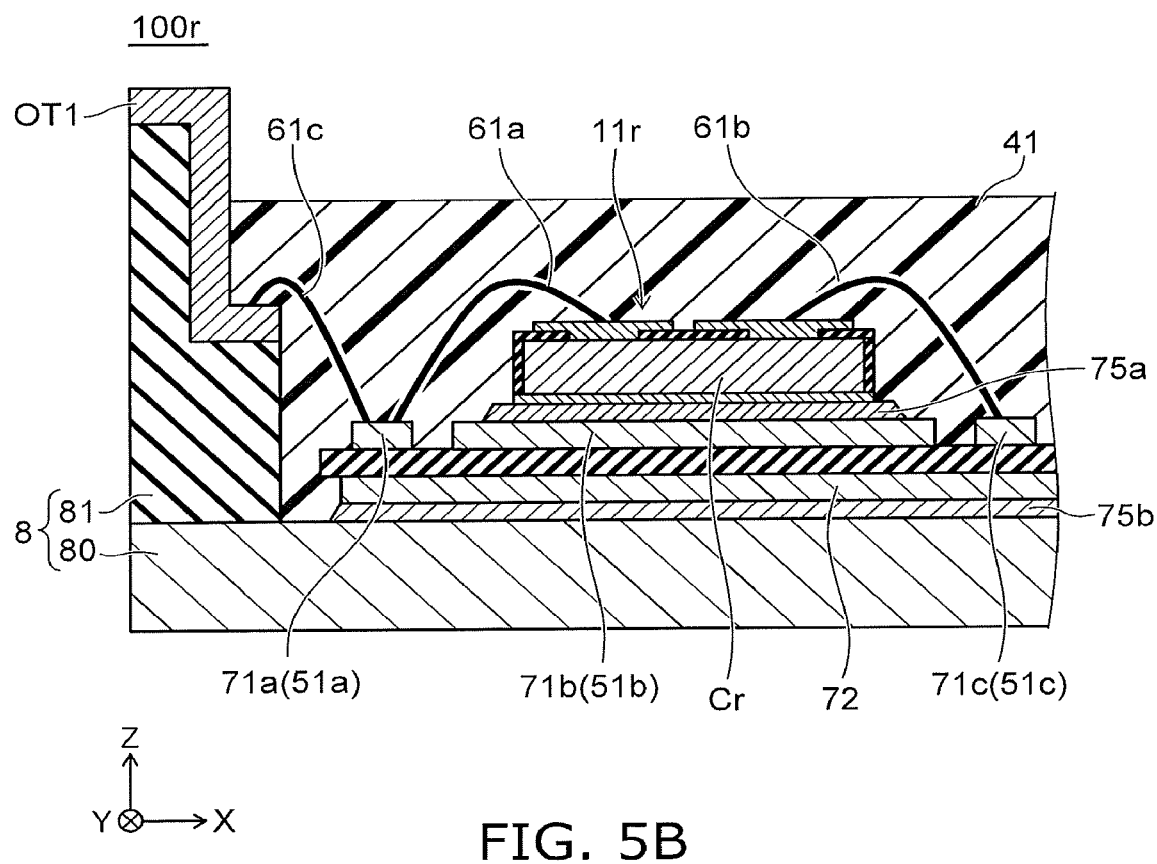

FIG. 5A and FIG. 5B are schematic cross-sectional views illustrating a semiconductor device according to a reference example. The cross section shown in FIG. 5A corresponds to, for example, the cross section shown in FIG. 4, and the cross section shown in FIG. 5B corresponds to, for example, the cross section shown in FIG. 3.

In a semiconductor device 100r according to the reference example, a semiconductor element 11r is not covered with the first element insulating part 21. In the semiconductor element 11r, for example, in order to perform a breakdown voltage test, for example, if a high voltage V is applied between the first chip electrode 11a and the second chip electrode 11b, discharge may occur. For example, the discharge occurs over the first surface c11, the third to sixth surfaces c13 to c16, and occurs from the first chip electrode 11a toward the second chip electrode 11b and a semiconductor chip Cr (FIG. 4A shows a state in which the discharge occurs over the first surface c11 and the third surface c13, and occurs from the first chip electrode 11a toward the second chip electrode 11b or the semiconductor chip Cr). For this reason, evaluation of the breakdown voltage of the single semiconductor element 11r is difficult.

Therefore, as shown in FIG. 5B, the breakdown voltage test of the semiconductor element 11r is performed after the semiconductor element 11r is mounted in the case member 8 and is sealed by the insulating sealing member 41. In the case where the breakdown voltage of the semiconductor element 11r does not meet the required breakdown voltage, for the semiconductor device 100r, the case member 8 and the insulating sealing member 41 are sorted as rejected items. Not only the semiconductor element 11r but also the case member 8 and the insulating sealing member 41 are wasted. In addition, time required for each of mounting process to the case member 8 and sealing process by the insulating sealing member 41 is wasted, and throughput in manufacturing the semiconductor device 100r is lowered. Furthermore, in the case where the semiconductor element 11r is multiply mounted in the case member 8, if at least one semiconductor element 11r not requested yet is mounted, the semiconductor device 100r is sorted as rejected item. For this reason, another semiconductor element 11r mounted together is also wasted. The other semiconductor element 11r has a possibility to meet the requested breakdown voltage.

On the contrary, the semiconductor device 100a according to the first embodiment includes the first element insulating part 21. For this reason, for example, even if the high voltage V is applied between the first chip electrode 11a and the second chip electrode 11b (see FIG. 4) in order to perform the breakdown voltage test for the first semiconductor element 11, the discharge is difficult to occur in comparison with the semiconductor element 11r. The high voltage V is, for example, not less than 500 V. Although an upper limit of the high voltage V is considered to be raised by future breakdown voltage improvement of the semiconductor element, the current status is not more than 3500 V. The breakdown voltage test of the first semiconductor element 11 can be performed before the semiconductor element 11 is mounted and sealed in the case member 8. Therefore, for the semiconductor device 110a according to the first embodiment, the semiconductor element 11 meeting the requested breakdown voltage can be mounted and sealed in the case member 8, and thus the throughput in the manufacturing is improved.

According to the first embodiment like this, the yield of the semiconductor device 100a after the mounting process and the sealing process can be improved in comparison with the reference example, for example.

According to the first embodiment, the following advantages (1) to (3) are further obtained.
 (1) Number of losses of the case member 8 can be reduced.
 (2) Amount to use of an insulative gel used for the insulating sealing member 41 can be reduced.
 (3) The throughput in manufacturing the semiconductor device 100a can be improved.

Therefore, according to the semiconductor device 100a, the advantage is found in the reduction of the manufacturing cost.

Furthermore, according to the first embodiment, because the first semiconductor element 11 includes the first element insulating part 21, for example, in comparison with the case of no first element insulating part 21, the advantage that insulating property of the first semiconductor element 11 itself is improved is obtained as well.

The semiconductor device 100a according to the first embodiment is effective in the case where the first semiconductor element 11 is, for example, a semiconductor element based on silicon carbide (SiC) (hereinafter, referred to as SiC semiconductor element). The yield of the SiC semiconductor element is likely to be low in comparison with a semiconductor element based on Si (hereinafter, referred to as Si semiconductor element). For this reason, probability that the SiC semiconductor element mounted and sealed in the case member 8 meets the requested breakdown voltage is lower than the case of the Si semiconductor element.

Even if the semiconductor element 11 is the SiC semiconductor element, for the first semiconductor device 100a according to the first embodiment, for example, the breakdown voltage test can be performed before mounting and sealing in the case member 8. For this reason, for example, the SiC semiconductor element meeting the requested breakdown voltage can be mounted and sealed in the case member 8. Therefore, also in the case where the first semiconductor element 11 is the SiC semiconductor element, the yield of the semiconductor device 100a can be improved.

Therefore, the semiconductor device 100a according to the first embodiment is effective in the case where the first semiconductor element 11 is the SiC semiconductor element.

The semiconductor device 100a according to the first embodiment is a power semiconductor module which mounts multiple power semiconductor elements in one case member 8. A range of a current density of the power semiconductor module is, for example, 50 to 1000 A/cm$^2$. The semiconductor device 100a further includes a second semiconductor element 12, fourth to sixth terminal electrodes 51d to 51f, and sixth to tenth wiring members 61f to 61j.

A second semiconductor chip C2 included in the second semiconductor element 12 is a power semiconductor element, for example, IGBT. The second semiconductor element 12 has, for example, constituent components similar to the first semiconductor element 11. Hereinafter, the corresponding relationship between the constituent components will be described and the overlapping description will be adequately omitted.

The second semiconductor element 12 includes the second semiconductor chip C2, fourth to sixth chip electrodes 12d to 12f, a second element insulating part 22, and a second chip insulating part 32. The fourth to sixth chip electrodes 12d to 12f correspond to the first to third chip electrodes 11a to 11c, respectively. The second element insulating part 22 and the second chip insulating part 32 correspond to the second element insulating part 22 and the second chip insulating part 32, respectively. The second semiconductor chip C2 has seventh to twelfth surfaces c27 to c212. The seventh to twelfth surfaces c27 to c212 correspond to the first to sixth surfaces c11 to c16, respectively.

The wiring substrate 7 further includes fourth to sixth substrate electrodes 71d to 71f. The fourth to sixth substrate electrodes 71d to 71f correspond to the first to third substrate electrodes 71a to 71c, respectively. In the first embodiment, the fourth to sixth substrate electrodes 71d to 71f are, for example, the fourth to sixth terminal electrodes 51d to 51f.

A fifth substrate electrode 71e (fifth terminal electrode 51e) is, for example electrically connected to the fifth chip electrode 12e via a conductive third joining member 75c. The third joining member 75c is, for example, a solder. The third joining member 75c joins the second semiconductor element 12 to the wiring substrate 7, and electrically connects the fifth chip electrode 12e to the fifth terminal electrode 51e.

The sixth wiring member 61f electrically connects the fourth chip electrode 12d to the fourth substrate electrode 71d (fourth terminal electrode 51d). The seventh wiring member 61g electrically connects the sixth chip electrode 12f to the sixth substrate electrode 71f (sixth terminal electrode 51f). The sixth, seventh wiring members 61f and 61g pass through the insulating sealing member 41. For example, the sixth, seventh wiring members 61f and 61g are a bonding wire, respectively.

The insulating part 81 further includes fourth to sixth external terminals OT4 to OT6. An eighth wiring member 61h electrically connects the fourth substrate electrode 71d (fourth terminal electrode 51d) to the fourth external terminal OT4. A ninth wiring member 61i electrically connects the fifth substrate electrode 71e (fifth terminal electrode 51e) to the fifth external terminal OT5. A tenth wiring member 61j electrically connects the sixth substrate electrode 71f (sixth terminal electrode 51f) to the sixth external terminal OT6. The eighth to tenth wiring members 61h to 61j pass through the insulating sealing member 41. For example, the eighth to tenth wiring members 61h to 61j are a bonding wire, respectively.

The fourth external terminal OT4 is also possible to be electrically connected to the fourth chip electrode 12c, for example, by a wiring member such as a bonding wire. In such a case, the fourth external terminal OT4 serves as the fourth terminal electrode 51d. Similarly, the sixth external terminal OT6 is also possible to be electrically connected to the sixth chip electrode 12f, for example, by a wiring member such as a bonding wire. In such a case, the sixth external terminal OT6 serves as the sixth terminal electrode 51f.

The first substrate electrode 71a and the fourth substrate electrode 71d may be one substrate electrode. The second substrate electrode 71b and the fifth substrate electrode 71e may be one substrate electrode. The third substrate electrode 71c and the sixth substrate electrode 71f may be one substrate electrode. Planar patterns of the first to sixth substrate electrodes 71a to 71f are arbitrary. The example of the planar patterns will be described later.

Furthermore, the first external terminal OT1 and the fourth external terminal OT4 may be one external terminal. The second external terminal OT2 and the fifth external terminal OT5 may be one external terminal. The third external terminal OT3 and the sixth external terminal OT6 may be one external terminal.

As well as the first semiconductor element 11, the second semiconductor element 12 is, for example, covered with the second element insulating part 22 except portions of the fourth to sixth chip electrodes 12d to 12f. In this state, the second semiconductor element 12 is mounted in the case member 8 with the first semiconductor element 11 and sealed by the insulating sealing member 41.

For the power semiconductor module, with increase of number of semiconductor elements mounted in the case member, a probability that all mounted semiconductor elements meet the requested breakdown voltage decreases, and maintaining and improving yield become difficult. On the contrary, in the semiconductor device 100a, the semiconductor elements meeting the requested breakdown voltage can be stored beforehand, and only the semiconductor elements meeting the requested breakdown voltage can be mounted. Therefore, according to the semiconductor device 100a, even if the number of semiconductor elements mounted increases in the power semiconductor module, maintaining and improving the yield is possible.

(Second Embodiment)

Figure 6A:
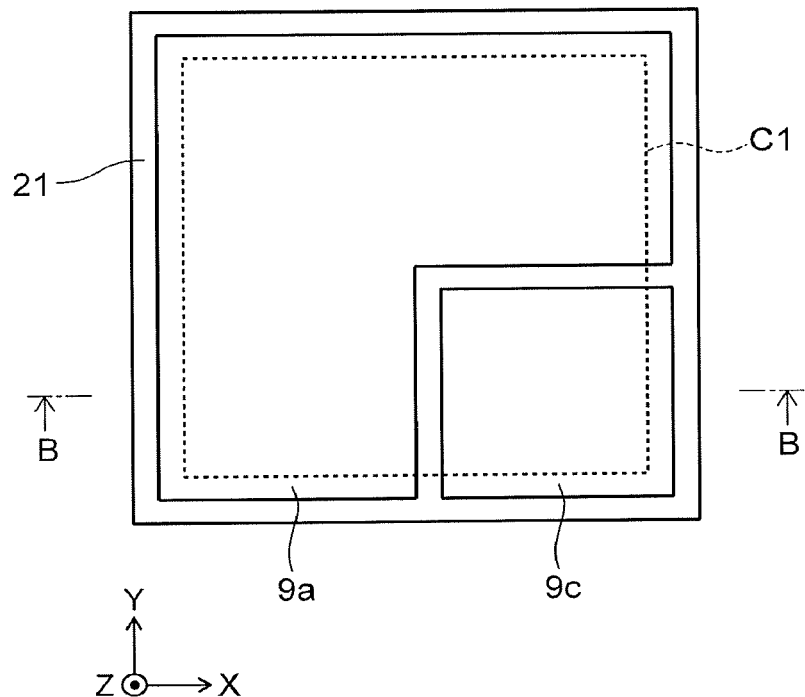
FIG. 6A is a schematic plan view illustrating a semiconductor element included in a semiconductor device according to a second embodiment.
Figure 6B:
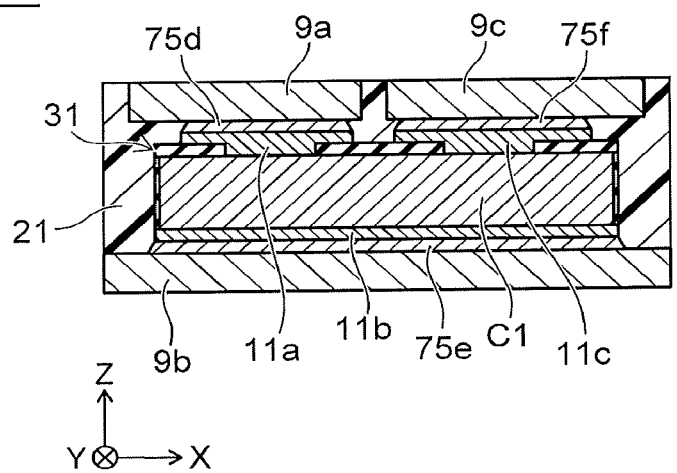
FIG. 6B is a schematic cross-sectional view along B-B line in FIG. 6A.
Figure 7A:
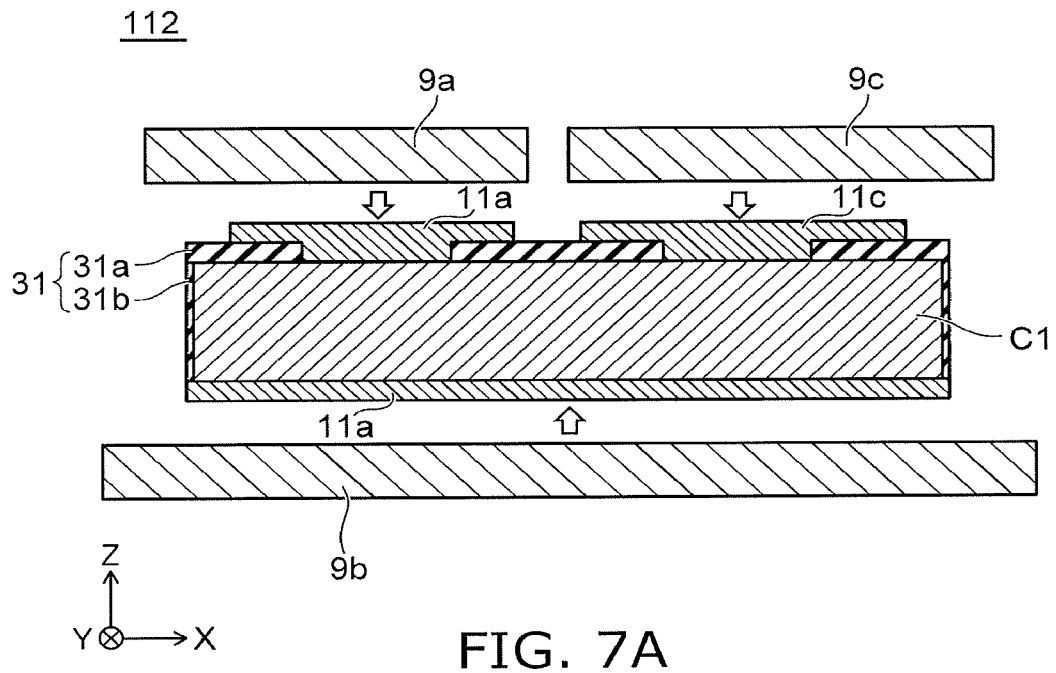
FIG. 7A and FIG. 7B are schematic cross-sectional views illustrating a method for manufacturing the semiconductor element.
Figure 7B:
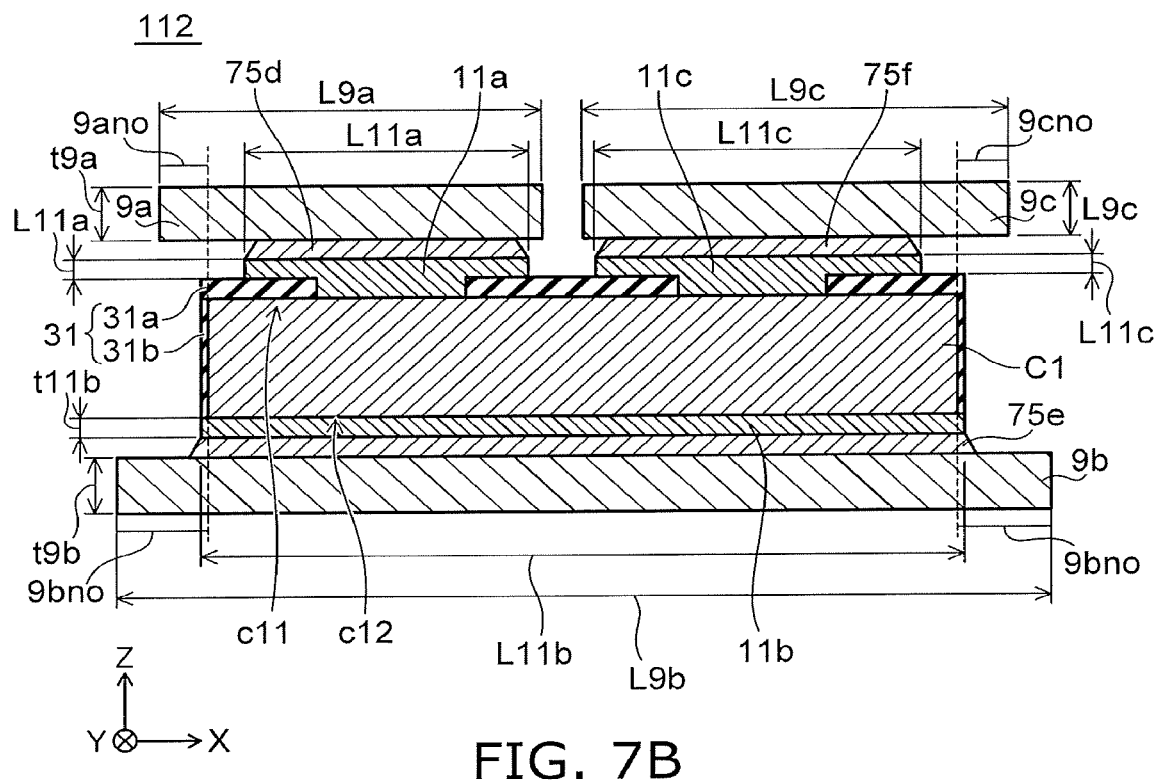
Figure 8:
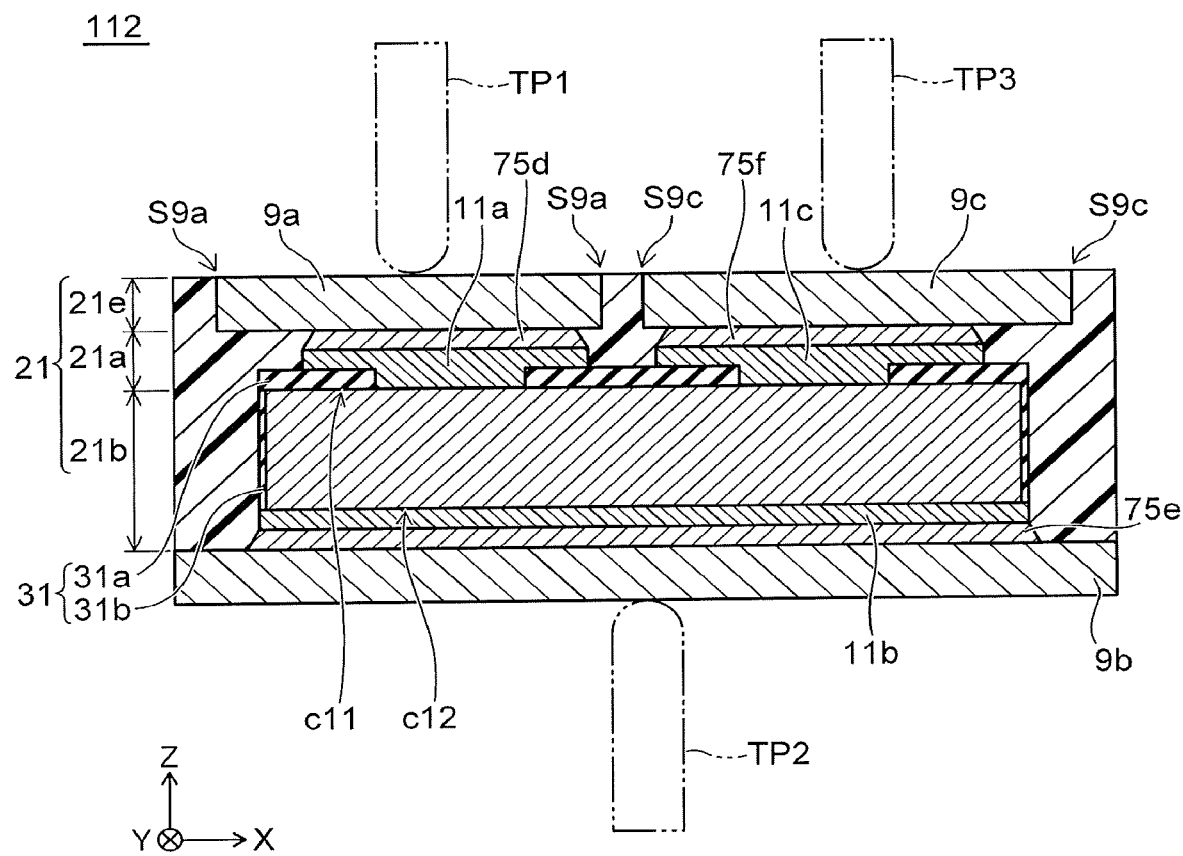
FIG. 8 is a schematic cross-sectional view illustrating the semiconductor element included in the semiconductor device according to the second embodiment.
Figure 9:
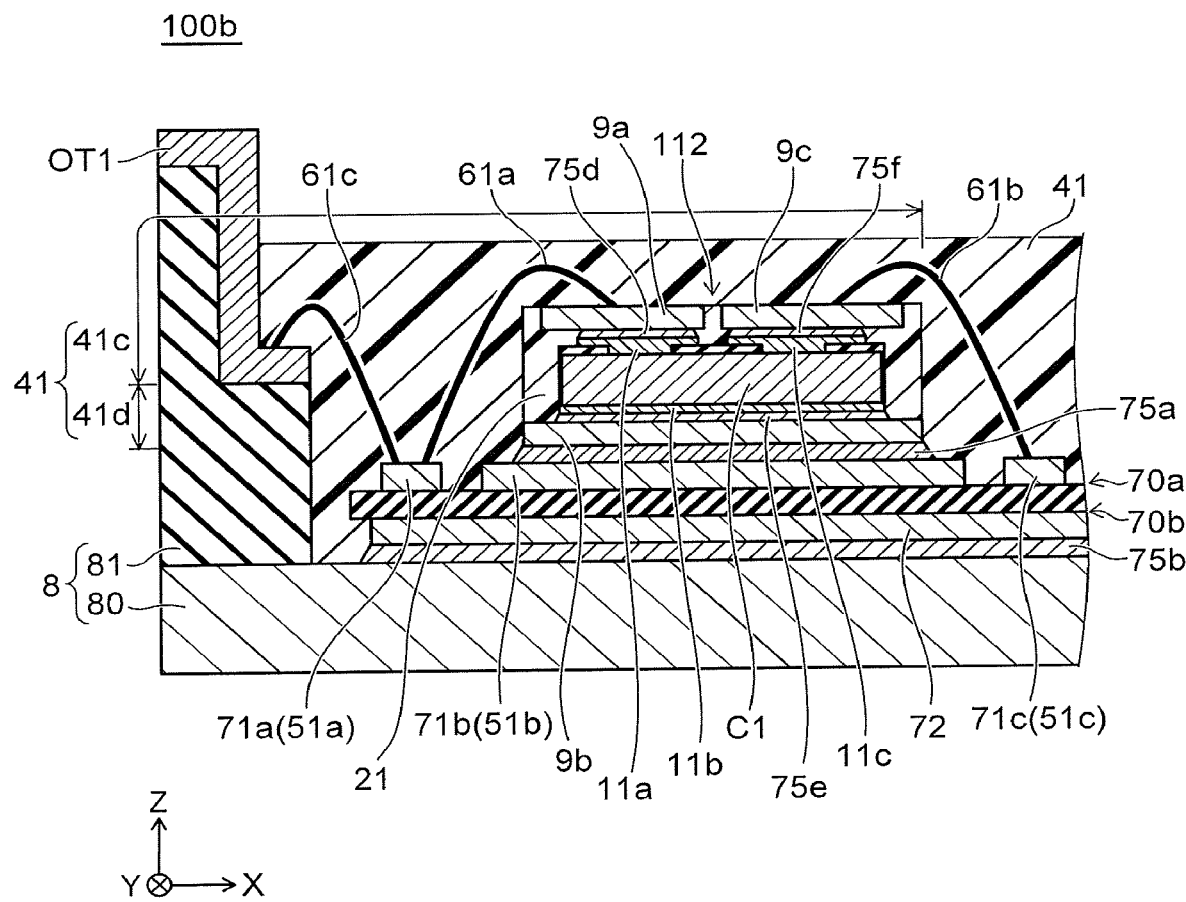
FIG. 9 is a schematic cross-sectional view illustrating the semiconductor device according to the second embodiment.

FIG. 6A is a schematic plan view illustrating a semiconductor element 112 included in a semiconductor device according to a second embodiment. FIG. 6B is a schematic cross-sectional view along B-B line in FIG. 6A. FIG. 7A and FIG. 7B are schematic cross-sectional views illustrating a method for manufacturing the semiconductor element 112 included in the semiconductor device according to the second embodiment. FIG. 8 is schematic cross-sectional view illustrating the semiconductor element 112 included in the semiconductor device according to the second embodiment. FIG. 9 is a schematic cross-sectional view illustrating the semiconductor device 100b according to the second embodiment.

As shown in FIG. 6A to FIG. 9, the semiconductor element 112 further includes first to third extraction electrodes 9a to 9c, and fourth to sixth joining members 75d to 75f in addition to the configuration included in the first semiconductor element 11. The first chip electrode 11a is positioned between the first semiconductor chip C1 and the first extraction electrode 9a. The second chip electrode 11b is positioned between the first semiconductor chip C1 and the second extraction electrode 9b. The third chip electrode 11c is positioned between the first semiconductor chip C1 and the third extraction electrode 9c. The first to third extraction electrodes 9a to 9c are, for example, made of a metal. A metal with good heat dissipation should be selected as the metal. One example of the metal with good heat dissipation is Cu.

The fourth joining member 75d is positioned between the first extraction electrode 9a and the first chip electrode 11a. The fifth joining member 75e is positioned between the second extraction electrode 9b and the second chip electrode 11b. The sixth joining member 75f is positioned between the third extraction electrode 9c and the third chip electrode 11c. The fourth to sixth joining members 75d to 75f join the first to third extraction electrodes 9a to 9c to the first to third chip electrodes 11a to 11c, respectively. Furthermore, the fourth to sixth joining members 75d to 75f electrically connect the first to third chip electrodes 11a to 11c to the first to third extraction electrodes 9a to 9c, respectively.

One example of the way of joining the first to third extraction electrodes 9a to 9c to the first to third chip electrodes 11a to 11c by the fourth to sixth joining members 75d to 75f is shown in FIG. 7A and FIG. 7B. For example, as shown in FIG. 7A, the first to third extraction electrodes 9a to 9c are opposed to the first to third chip electrodes 11a to 11c. Next, as shown in FIG. 7B, the first to third extraction electrodes 9a to 9c are joined to the first to third chip electrodes 11a to 11c, respectively by the fourth to sixth joining members 75d to 75f. The fourth to sixth joining members 75d to 75f are, for example, solder. The first to third extraction electrodes 9a to 9c can be based on a heat dissipation frame.

As shown in FIG. 7B, thicknesses t9a to t9c in the Z-axis direction of the first to third extraction electrodes 9a to 9c are thicker than thicknesses t11a to t11c in the Z-axis direction of the first to third chip electrodes 11a to 11c, respectively, for example. Here, the thicknesses t11a and t11c are, for example, thicknesses from the first insulating region 31a, respectively. The thickness t11b is, for example, a thickness from the second surface c12. The thickness in the Z-axis direction is taken as an electrode part Z-axis direction distance when the electrode part is cut along a plane parallel to the Z-axis direction.

As shown in FIG. 7B, lengths L9a to L9c in the X-axis direction of the first to third extraction electrodes 9a to 9c are, for example, longer than lengths L11a to L11c in the X-direction of the first to third chip electrodes 11a to 11c, respectively. The first to third extraction electrodes 9a to 9c include, for example, non-overlapping regions 9ano to 9cno not overlapping the first semiconductor chip C1, respectively in a ZX cross section along the X-axis direction. The length in the X-direction is taken as an electrode part X-axis direction distance when the electrode part is cut along a plane parallel to the X-axis direction.

Next, as shown in FIG. 8, the first semiconductor chip C1 is covered with the first element insulating part 21. The semiconductor element 112 is covered with the first element insulating part 21, for example, except electrical connection points of the first to third extraction electrodes 9a to 9c, for example. In the second embodiment, the first element insulating part 21 further includes a fifth portion 21e. The fifth portion 21e is, for example, continuous to the first portion 21a. The first extraction electrode 9a and the third extraction electrode 9c have surface S9a and surface S9c crossing the X-direction, respectively. The surface S9a and the surface S9b cross, for example, the first surface c11, respectively.

The first portion 21a is positioned between the first surface c11 and the first extraction electrode 9a. The second portion 21b is continuous to the first portion 21a along the third surface c13. The fifth portion 21e is continuous to the first portion 21a, and contacts the surface S9a. The first portion 21a is positioned between the second portion 21b and the fifth portion 21e in the Z-axis direction.

In the second embodiment, the first extraction electrode 9a, the fourth joining member 75d, and the first chip electrode 11a form an emitter electrode region. The second extraction electrode 9b, the fifth joining member 75e, and the second chip electrode 11b form a collector electrode region. The third extraction electrode 9c, the sixth joining member 75f, and the third chip electrode 11c form a gate electrode region. In the second embodiment, the first element insulating part 21 contacts the first extraction electrode 9a, the fourth joining member 75d, the first chip electrode 11a, the third extraction electrode 9c, the sixth joining member 75f, and the third chip electrode 11c. The first element insulating part 21 electrically insulates the emitter electrode region from the collector electrode region. Furthermore, the first element insulating part 21 electrically insulates the gate electrode region from the collector electrode region. Furthermore, the first element insulating part 21 electrically insulates the emitter electrode region from the gate electrode region.

Next, as shown in FIG. 9, the semiconductor element 112 is joined, for example, by the second joining member 75b on the second substrate electrode 71b (second terminal electrode 51b) of the wiring substrate 7. In the second embodiment, the second joining member 75b joins the second extraction electrode 9b to the second substrate electrode 71b (second terminal electrode 51b), and electrically connects the second extraction electrode 9b to the second substrate electrode 71b. For example, a melting point of the second joining member 75b may be, for example, lower than melting points of the fourth to sixth joining members 75d to 75f. Thereby, the fourth to sixth joining members 75d to 75f can be suppressed from being melted when the semiconductor element 112 is joined to the wiring substrate 7.

In the second embodiment, the first wiring member 61a electrically connects the first extraction electrode 9a to the first substrate electrode 71a (first terminal electrode 51a). The second wiring member 61b electrically connects the third extraction electrode 9c to the third substrate electrode 71c (third terminal electrode 51c).

According to the semiconductor element 112, the first to third extraction electrodes 9a to 9c are joined to the first to third chip electrodes 11a to 11c, respectively. According to the semiconductor element 112, for example, the following advantages can be obtained.

The first to third chip electrodes 11a to 11c are formed by using, for example, a physical vapor deposition method such as a sputtering method in the manufacturing process of the semiconductor element. Thicknesses t11a to t11c in the X-direction of the first to third chip electrodes 11a to 11c are thin. For example, it is difficult to cause voltage application probes TP1 to TP3 to directly contact the thin first to third chip electrodes 11a to 11c. For example, a thickness in the X-axis direction of the first semiconductor chip C1 is thin and a mechanical strength is low. For this reason, if the voltage application probes TP1 to TP3 are caused to contact the first to third chip electrodes 11a to 11c, there is a possibility that the first semiconductor chip C1 is damaged.

For such circumstances, the semiconductor element 112 includes the first to third extraction electrodes 9a to 9c. The first to third extraction electrodes 9a to 9c are possible to be formed by, for example, joining plate-like conductive members to the first to third chip electrodes 11a to 11c. The first to third extraction electrodes 9a to 9c are possible to be thick in comparison with films formed by using the physical vapor deposition method, for example. The first to third extraction electrodes 9a to 9c can be in contact with the voltage application probes TP1 to TP3 in comparison with the first to third chip electrodes 11a to 11c, for example, while suppressing the possibility of causing the first semiconductor chip C1 to be damaged.

The semiconductor element 112 includes the first element insulating part 21. For this reason, the mechanical strength of the semiconductor element 112 is also possible to be high. The mechanical strength of the semiconductor element 112 can be more improved, for example, by causing the first element insulating part 21 to be positioned as following.

In the Z-axis direction, causing the first element insulating part 21 to be positioned between the first extraction electrode 9a and the second extraction electrode 9b, In the Z-axis direction, causing the first element insulating part 21 to be positioned between the third extraction electrode 9c and the second extraction electrode 9b.

Thereby, the mechanical strength of the semiconductor element 112 can be higher than the first semiconductor element 11 and the second semiconductor element 12, for example.

Furthermore, if for example, lengths L9a to L9c in the X-axis direction of the first to third extraction electrodes 9a to 9c are made longer than, for example, lengths L11a to L11c in the X-axis direction of the first to third chip electrodes 11a to 11c, respectively, it is also possible to further improve the heat dissipation of the semiconductor element 112 in comparison with the semiconductor element 11.

(Third Embodiment)

Figure 10A:
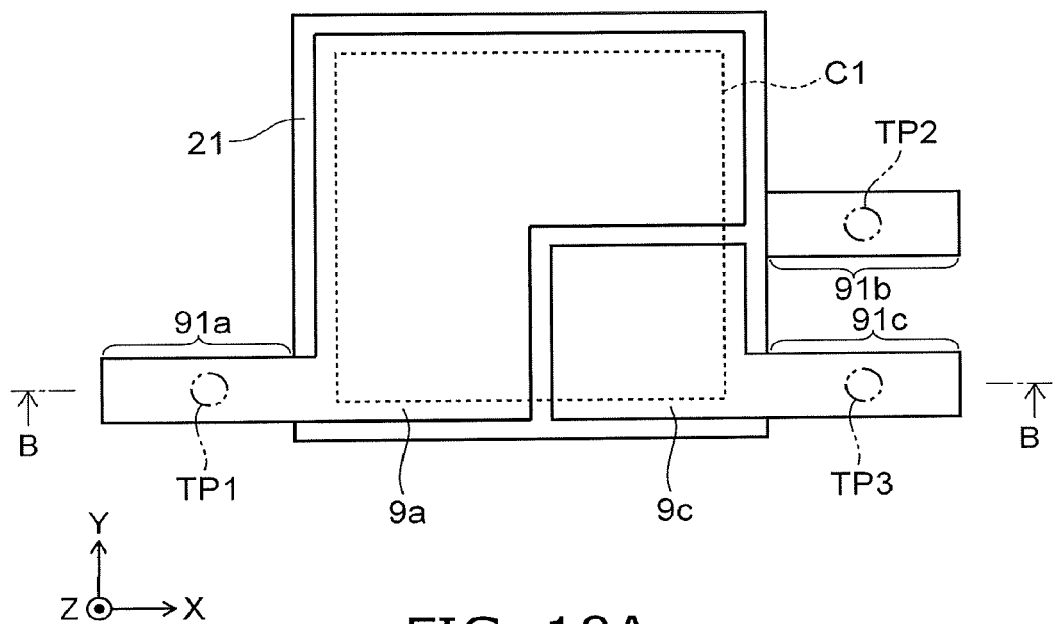
FIG. 10A is a schematic plan view illustrating a semiconductor element included in a semiconductor device according to a third embodiment.
Figure 10B:
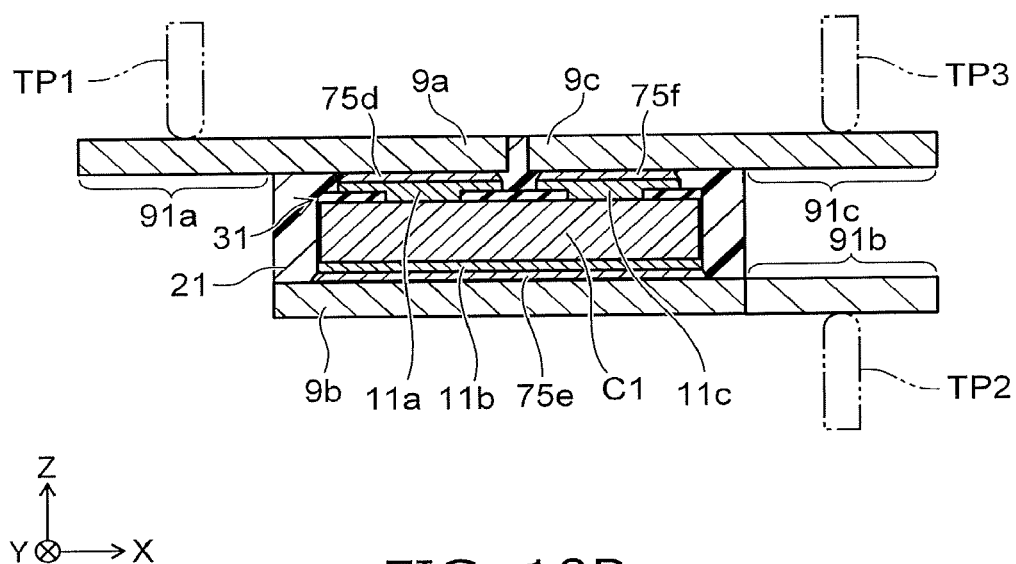
FIG. 10B is a schematic cross-sectional view along B-B line in FIG. 10A.
Figure 11A:
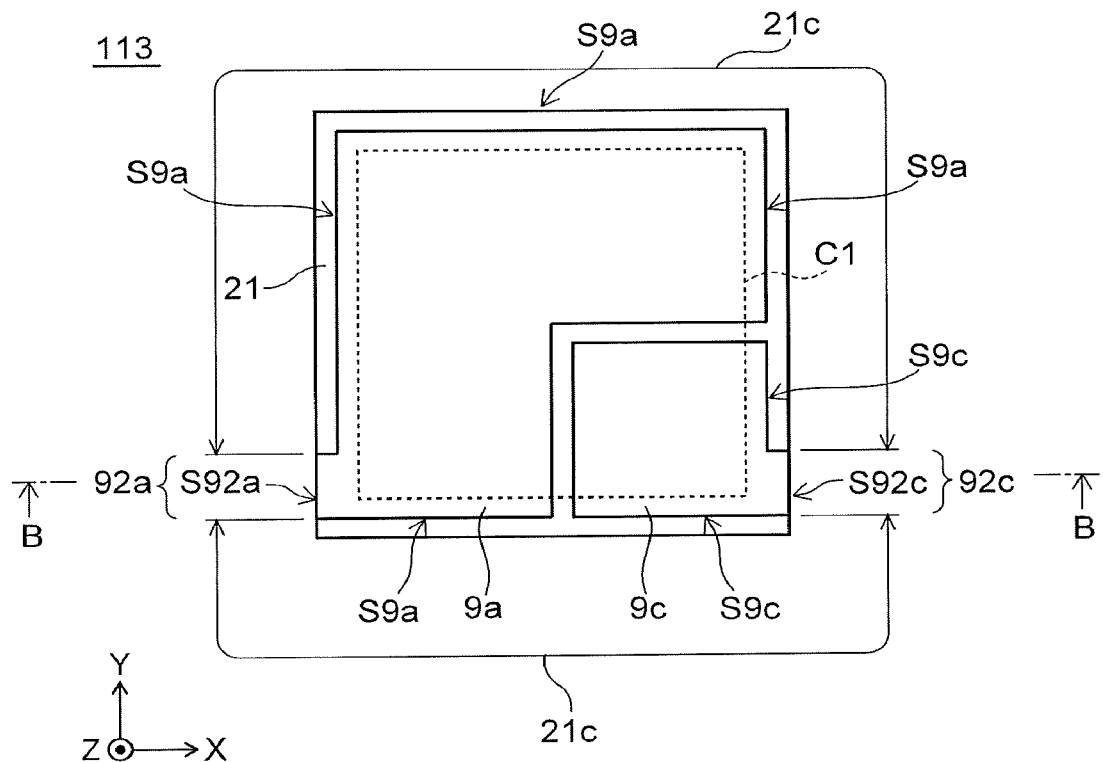
FIG. 11A is a schematic plan view illustrating the semiconductor element included in the semiconductor device according to a third embodiment.
Figure 11B:
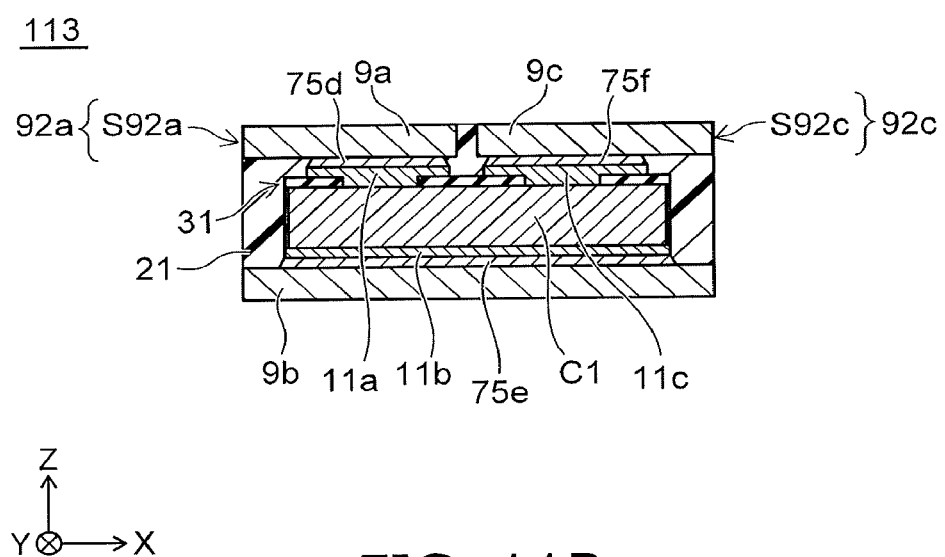
FIG. 11B is a schematic cross-sectional view along B-B line in FIG. 11A.

FIG. 10A is a schematic plan view illustrating a semiconductor element 113 included in a semiconductor device according to a third embodiment. FIG. 10B is a schematic cross-sectional view along B-B line in FIG. 10A. FIG. 11A is a schematic plan view illustrating the semiconductor element 113 included in the semiconductor device according to the third embodiment. FIG. 11B is a schematic cross-sectional view along B-B line in FIG. 11A. FIG. 10A and FIG. 10B show the semiconductor element 113 at a test, and FIG. 11A and FIG. 11B show the semiconductor element 113 after the test.

As shown in FIG. 10A and FIG. 10B, the first to third extraction electrodes 9a to 9c of the semiconductor element 113 further include first to third test electrode parts 91a to 91c. The first test electrode part 91a is continuous to the first extraction electrode 9a in the X-axis direction, and includes a region not overlapping the first semiconductor chip C1 and the first element insulating part 21 in the Z-axis direction. The second test electrode part 91b is continuous to the second extraction electrode 9b in the X-axis direction, and includes a region not overlapping the first semiconductor chip C1 and the first element insulating part 21 in the Z-axis direction. The third test electrode part 91c is continuous to the third extraction electrode 9c in the X-axis direction, and includes a region not overlapping the first semiconductor chip C1 and the first element insulating part 21 in the Z-axis direction. In the third embodiment, the voltage application probes TP1 to TP3 are in contact with the first to third test electrode parts 91a to 91c, respectively, and the test, for example, the test including a breakdown voltage test is performed.

As shown in FIG. 11A and FIG. 11B, after the test, for example, the first to third test electrode parts 91a to 91c are cut, and the first to third test electrode parts 91a to 91c are removed from the first to third extraction electrodes 9a to 9c, respectively. For example, the first extraction electrode 9a and the third extraction electrode 9c further include first exposed part 92a and third exposed part 92c, respectively. For example, the first exposed part 92a and the third exposed part 92c are traces of the first test electrode part 91a and the third test electrode part 91c, respectively. The first exposed part 92a and the third exposed part 92c include first exposed surface S92a and third exposed surface S92c crossing the X-axis direction, respectively. The first exposed surface S92a and the third exposed surface S92c are, for example, orthogonal to the X-axis direction. The first exposed surface S92a and the third exposed surface S92c are not covered with the first element insulating part 21, respectively. Each of the first exposed surface S92a and the third exposed surface S92c is exposed from the third portion 21c of the first element insulating part 21. The surfaces S9a and the surface S9c are covered with the third portion 21c of the first element insulating part 21, respectively.

In the semiconductor element 113, for example, the voltage application probes TP1 to TP3 contact the first to third test electrode parts 91a to 91c, respectively, at the test. For this reason, it is possible that pressures of the voltage application probes TP1 to TP3 are caused not to be directly applied to, for example, the first semiconductor chip C1. Therefore, according to the semiconductor element 113, for example, in comparison with the semiconductor element 112, the possibility of the damage of the semiconductor chip C1 at the test can be further suppressed to be low.

(Fourth Embodiment)

Figure 12A:
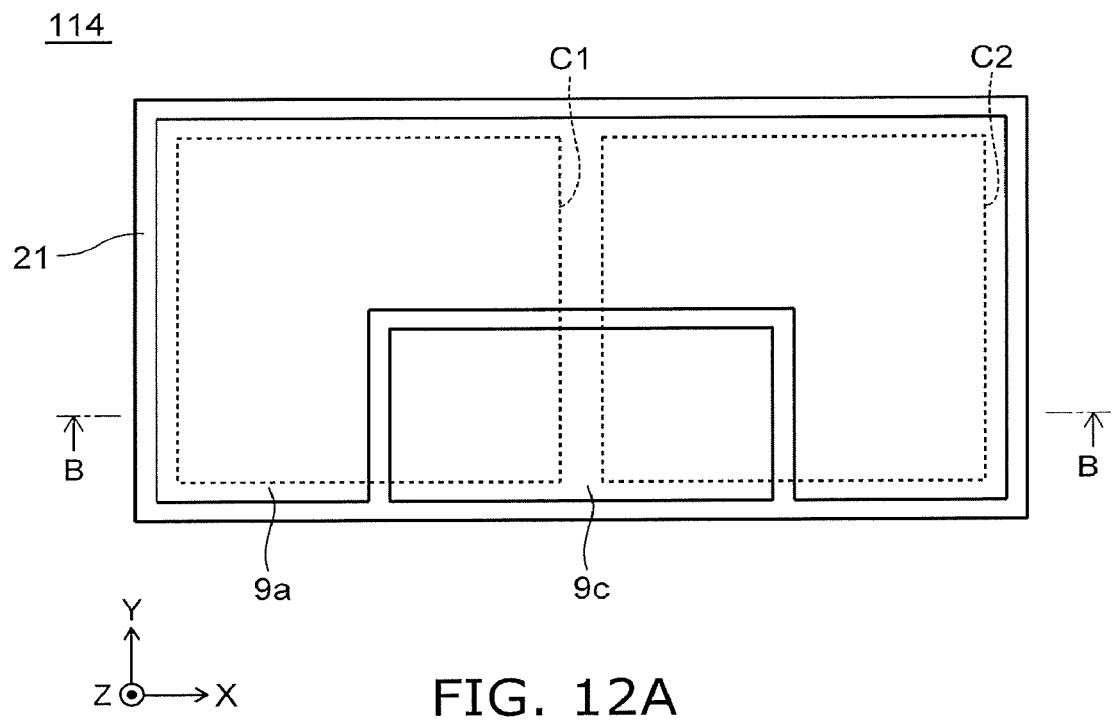
FIG. 12A is a schematic plan view illustrating a semiconductor element included in a semiconductor device according to a fourth embodiment.
Figure 12B:
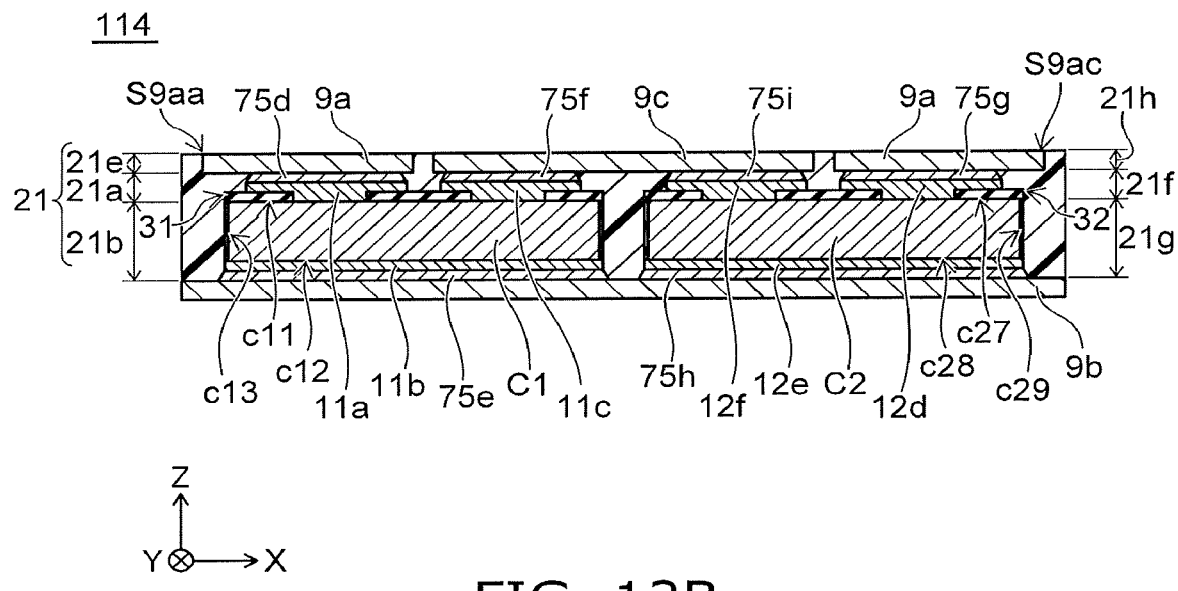
FIG. 12B is a schematic cross-sectional view along B-B line in FIG. 12A.

FIG. 12A is a schematic plan view illustrating a semiconductor element 114 included in a semiconductor device according to a fourth embodiment. FIG. 12B is a schematic cross-sectional view along B-B line in FIG. 12A.

As shown in FIG. 12A and FIG. 12B, the semiconductor element 114 further includes, for example, a second semiconductor chip C2 in addition to the first semiconductor chip C1 of the second embodiment. In the fourth embodiment, the second semiconductor chip C2 includes the same power semiconductor element as the power semiconductor element included in the first semiconductor chip C1. The same power semiconductor element is, for example, IGBT. The second semiconductor chip C2 has a seventh surface c27, an eighth surface c28 and a ninth surface c29. The seventh surface c27 crosses the Z-axis direction. The eighth surface c28 is distant from the seventh surface c27 and crosses the Z-axis direction. The ninth surface c29 is positioned between the seventh surface c27 and the eighth surface c28. The seventh, eighth surfaces c27 and c28 are a surface and a back side, respectively, and the ninth surface c29 is one of side surfaces.

The fourth chip electrode 12d is disposed on the seventh surface c27, and electrically connected to an emitter region of the second semiconductor chip C2. The fifth chip electrode 12e is disposed on the eighth surface c28, and electrically connected to a collector region of the second semiconductor chip C2. The sixth chip electrode 12f is disposed on the seventh surface c27, and electrically connected to a gate electrode of the second semiconductor chip C2.

The first extraction electrode 9a has a surface S9aa along a direction crossing the first surface c11, and a surface S9ac along a direction crossing the seventh surface c27. The first chip electrode 11a is positioned between the first surface c11 and the first extraction electrode 9a. The fourth chip electrode 12d is positioned between the seventh surface c27 and the first extraction electrode 9a. The first extraction electrode 9a is joined to each of the first, fourth chip electrodes 11a and 12d by the fourth, seventh joining member 75d and 75g, and electrically connected.

The second chip electrode 11b is positioned between the second surface c12 and the second extraction electrode 9b. The fifth chip electrode 12e is positioned between the eighth surface c28 and the second extraction electrode 9b. The second extraction electrode 9b is joined to each of the second chip electrode 11b and the fifth chip electrode 12e by the fifth joining member 75e and the eighth joining member 75h, and electrically connected.

Third chip electrode 11c is positioned between the first surface c11 and the third extraction electrode 9c. The sixth chip electrode 12f is positioned between the seventh surface c27 and the third extraction electrode 9c. The third extraction electrode 9c is joined to each of the third chip electrode 11c and the sixth chip electrode 12f by the sixth joining member 75f and the ninth joining member 75i, and electrically connected.

The first element insulating part 21 includes the first portion 21a, the second portion 21b, the fifth portion 21e, a sixth portion 21f, a seventh portion 21g and an eighth portion 21h. The first portion 21a is positioned between the first surface c11 and the first extraction electrode 9a. The second portion 21b is continuous to the first portion 21a along the third surface c13. The fifth portion 21e is continuous to the first portion 21a, and contacts the surface S9aa along the direction crossing the first surface c11. The sixth portion 21f is positioned between the seventh surface c27 and the first extraction electrode 9a. The seventh portion 21g is continuous to the sixth portion 21f along the eighth surface c28. The eighth portion 21h is continuous to the sixth portion 21g, and contacts the surface S9ac along the direction crossing the seventh surface c27.

In the fourth embodiment, the first element insulating part 21 covers the first semiconductor chip C1 and the second semiconductor chip C2, for example, except the electrical connection points of, for example, the first to third extraction electrodes 9a to 9c. The first element insulating part 21 electrically insulates the first to third extraction electrodes 9a to 9c one another. The semiconductor element 114 is a semiconductor package including multiple semiconductor chips.

An area in an XY-plane of the semiconductor element 114 is taken as "S1". A total area in the XY-plane of the first semiconductor element 11 including the first semiconductor chip C1 and the second semiconductor element 12 including the second semiconductor chip C2 is taken as "S2". It is possible to make the area "S1" smaller than the area "S2". For example, this is because of no necessity of a gap between the first semiconductor element 11 and the second semiconductor element 12. Therefore, the fourth embodiment including the semiconductor element 114 is advantageous for downsizing of the power semiconductor module.

The first semiconductor chip C1 and the second semiconductor chip C2 may include different power semiconductor elements, respectively. For example, it is also possible that the first semiconductor chip C1 is IGBT and the second semiconductor chip is a diode. Furthermore, the number of semiconductor chips included in the semiconductor element 114 is not limited to "2". It is also possible that the semiconductor element 114 includes semiconductor chips "not less than 2".

For example, in the case where the first semiconductor chip C1 and the second semiconductor chip C2 are the same power semiconductor elements, respectively, the semiconductor element 114 can be dealt as follows as well.

After the first semiconductor chip C1 and the second semiconductor chip C2 are covered with the first element insulating part 21, the test including the breakdown voltage test is performed, for example. It is assumed that the semiconductor element 114 is determined not to meet the requirement. In such a case, there is a case where both of the first semiconductor chip C1 and the second semiconductor chip C2 do not meet the requirement and a case where one of the first semiconductor chip C1 and the second semiconductor chip C2 does not meet the requirement.

In the latter case, if only one of the first semiconductor chip C1 and the second semiconductor chip C2 can be used, the semiconductor element 114 can be relieved. For example, if it is known which of the first semiconductor chip C1 and the second semiconductor chip C2 has a "problem", the semiconductor element 114 can be relieved. The semiconductor chip with the problem is electrically separated from the semiconductor element 114. After the test, for example, the first to third extraction electrodes 9a to 9c are divided in two. One of the first extraction electrodes 9a is electrically connected to the first chip electrode 11a, and another one is electrically connected to the fourth chip electrode 12d. One of the second extraction electrodes 9b is electrically connected to the second chip electrode 11b, and another one is electrically connected to the fifth chip electrode 12e. One of the third extraction electrodes 9c is electrically connected to the third chip electrode 11c, and another one is electrically connected to the sixth chip electrode 12f.

In this way, for example, the first to third extraction electrodes 9a to 9c are divided every the first semiconductor chip C1 and the second semiconductor chip C2, respectively, and of the first semiconductor chip C1 and the second semiconductor chip C2, only semiconductor chips meeting the requirement are used. However, for example, the breakdown voltage decreases in comparison with the case where both of the first semiconductor chip C1 and the second semiconductor chip C2 meet the requirement. However, the semiconductor element 114 can be re-used in the case of a semiconductor device with a low breakdown voltage. According to the fourth embodiment, it is also possible to retrieve the semiconductor element 114.

(Fifth Embodiment)

Figure 13:
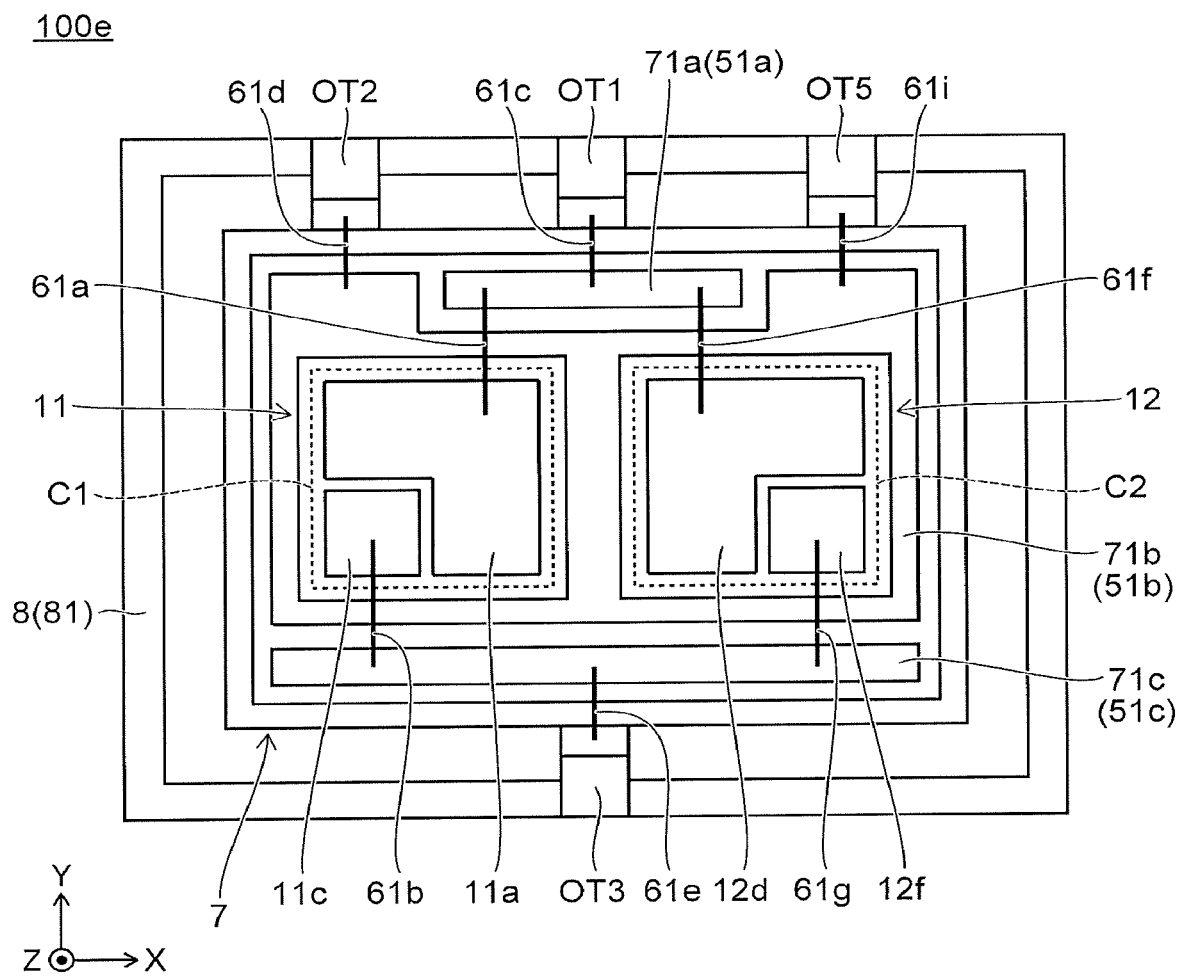
FIG. 13 is a schematic plan view illustrating a semiconductor device according to a fifth embodiment.

FIG. 13 is a schematic plan view illustrating a semiconductor device according to a fifth embodiment.

As shown in FIG. 13, the wiring substrate 7 of a semiconductor device 100e according to the fifth embodiment includes the first to third substrate electrodes 71a to 71c. In the fifth embodiment, the first substrate electrode 71a is electrically connected to the first chip electrode 11a and the fourth chip electrode 12d, respectively via the first wiring member 61a and the sixth wiring member 61f. The second substrate electrode 71b is electrically connected to the second chip electrode 11b and the fifth chip electrode 12e (not shown in FIG. 13), respectively via the first joining member 75a and the third joining member 75c (not shown in FIG. 13). The third substrate electrode 71c is electrically connected to the third chip electrode 11c and the sixth chip electrode 12f, respectively via the second wiring member 61b and the seventh wiring member 61g.

The fifth embodiment shows the example in which the first substrate electrode 71a and the fourth substrate electrode 71d are unified into one substrate electrode. Furthermore, the fifth embodiment shows the example in which the second substrate electrode 71b and the fifth substrate electrode 71e are unified into one substrate electrode. Furthermore, the fifth embodiment shows the example in which the third substrate electrode 71c and the sixth substrate electrode 71f are unified into on substrate electrode.

Like the fifth embodiment, the first substrate electrode 71a and the fourth substrate electrode 71d may be one substrate electrode. The second substrate electrode 71b and the fifth substrate electrode 71e may be one substrate electrode. The third substrate electrode 71c and the sixth substrate electrode 71f may be one substrate electrode.

(Sixth Embodiment)

Figure 14:
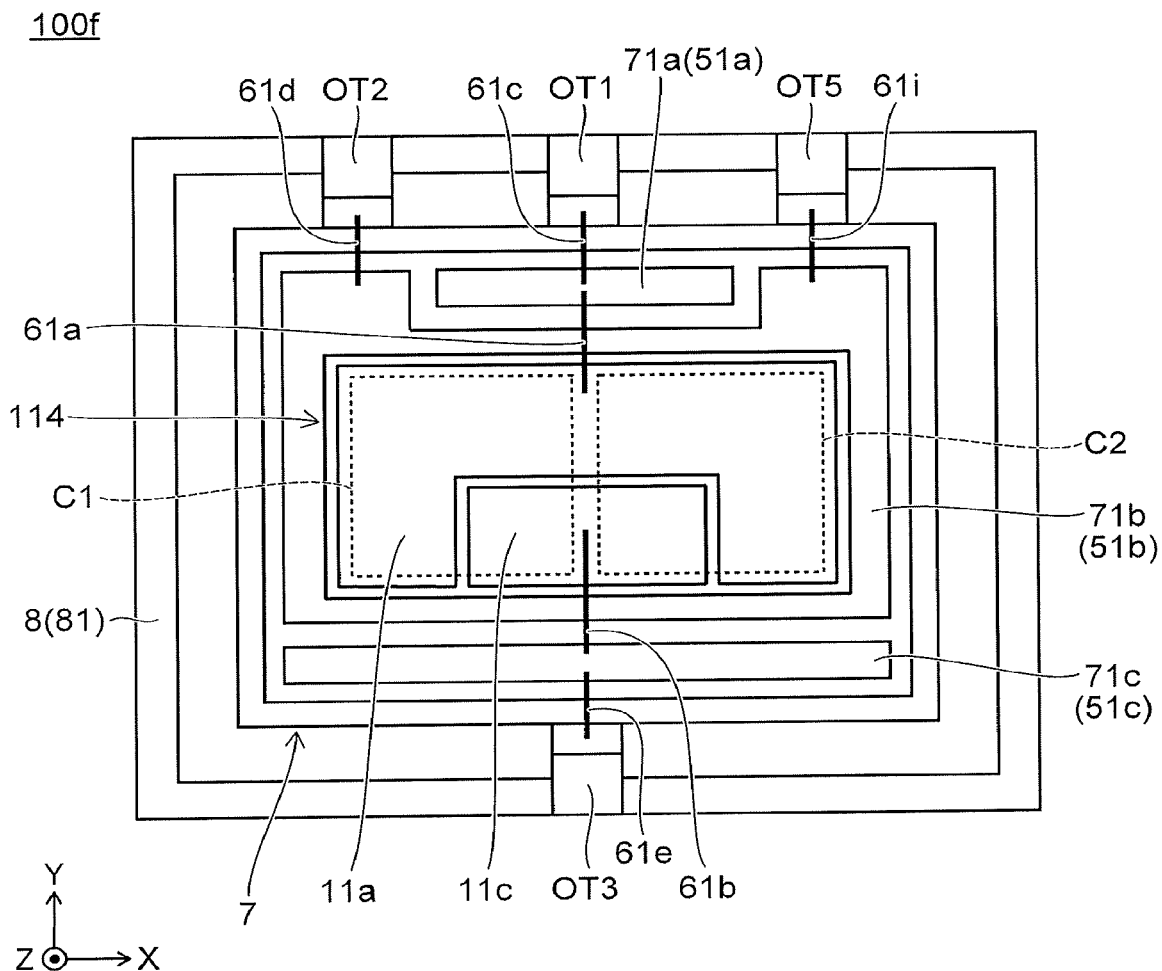
FIG. 14 is a schematic plan view illustrating a semiconductor device according to a sixth embodiment.

FIG. 14 is a schematic plan view illustrating a semiconductor device according to a sixth embodiment.

As shown in FIG. 14, a semiconductor device 100f according to the sixth embodiment shows the example in which the semiconductor element 114 described in the fourth embodiment is used in place of the first semiconductor element 11 and the second semiconductor element 12 of the semiconductor device 100e of the fifth embodiment.

By using the semiconductor element 114 in place of the first semiconductor element 11 and the second semiconductor element 12, the area in the XY-plane of the semiconductor device 100f including the first semiconductor chip C1 and the second semiconductor chip C2 can be reduced in comparison with the semiconductor device 100e.

Furthermore, the wiring members electrically connecting the first chip electrode (emitter) to the first substrate electrode can be reduced to one member of the first wiring member 61a, and thus it becomes possible to improve the yield in an assembly process and to reduce the wiring members. Therefore, according to the sixth embodiment, the cost reduction can be made in comparison with the fifth embodiment.

(Seventh Embodiment)

Figure 15:
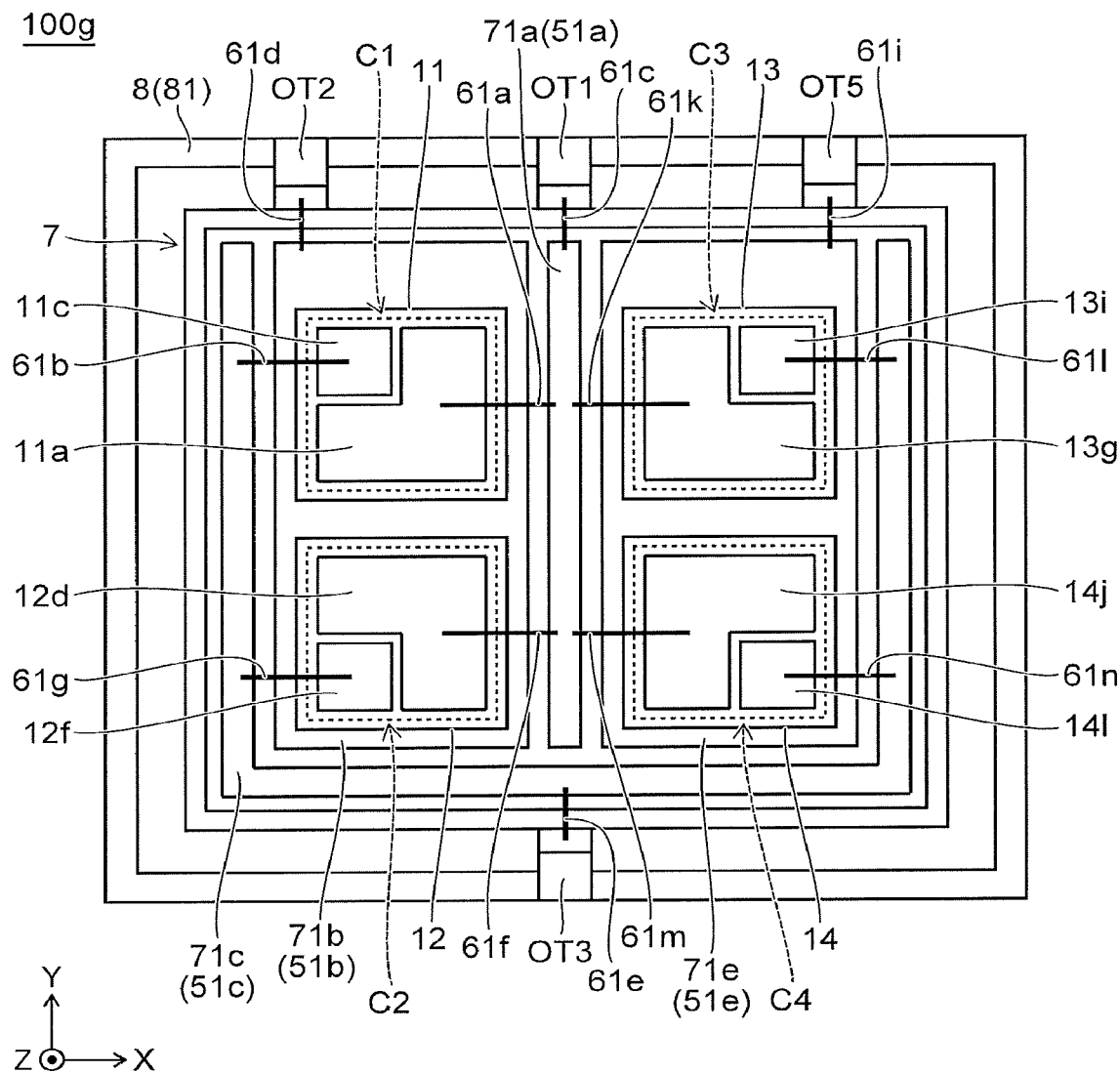
FIG. 15 is a schematic plan view illustrating a semiconductor device according to a seventh embodiment.

FIG. 15 is a schematic plan view illustrating a semiconductor device according to a seventh embodiment.

As shown in FIG. 15, a semiconductor device 100g according to the seventh embodiment further includes, for example, third semiconductor element 13 and the fourth semiconductor element 14 in comparison with the fifth embodiment.

In the seventh embodiment, the first substrate electrode 71a (51a) is set to be common for the first to fourth semiconductor elements 11 to 14, and the third substrate electrode 71c (51c) is set to be common for the first to fourth semiconductor elements 11 to 14. The second substrate electrode 71b (51b) is set to be common for the first semiconductor element 11 and the second semiconductor element 12, and the fifth substrate electrode 71e (51e) is set to be common for the third semiconductor element 13 and the fourth semiconductor element 14. The first substrate electrode 71a (51a) is disposed between the second substrate electrode 71b and the fifth substrate electrode 71e.

The first wiring member 61a, the sixth wiring member 61f, an eleventh wiring member 61k and a thirteenth wiring member 61m are electrically connected to the first substrate electrode 71a (51a). The eleventh wiring member 61k electrically connects a seventh chip electrode 13g to the first substrate electrode 71a (51a). The seventh chip electrode 13g is an emitter electrode of a third semiconductor chip C3. The thirteenth wiring member 61m electrically connects a tenth chip electrode 14j to the first substrate electrode 71a (51a). The tenth chip electrode 14j is an emitter electrode of a fourth semiconductor chip C4. The second wiring member 61b, a twelfth wiring member 61l and a fourteenth wiring member 61n are electrically connected to the third substrate electrode 71c (51c). The twelfth wiring member 61l electrically connects a ninth chip electrode 13i to the third substrate electrode 71c (51c). The ninth chip electrode 13i is a gate electrode of the third semiconductor chip C3. The fourteenth wiring member 61n electrically connects a twelfth chip electrode 14l to the third substrate electrode 71c (51c). The twelfth chip electrode 14l is a gate electrode of the fourth semiconductor chip C4.

Figure 16:
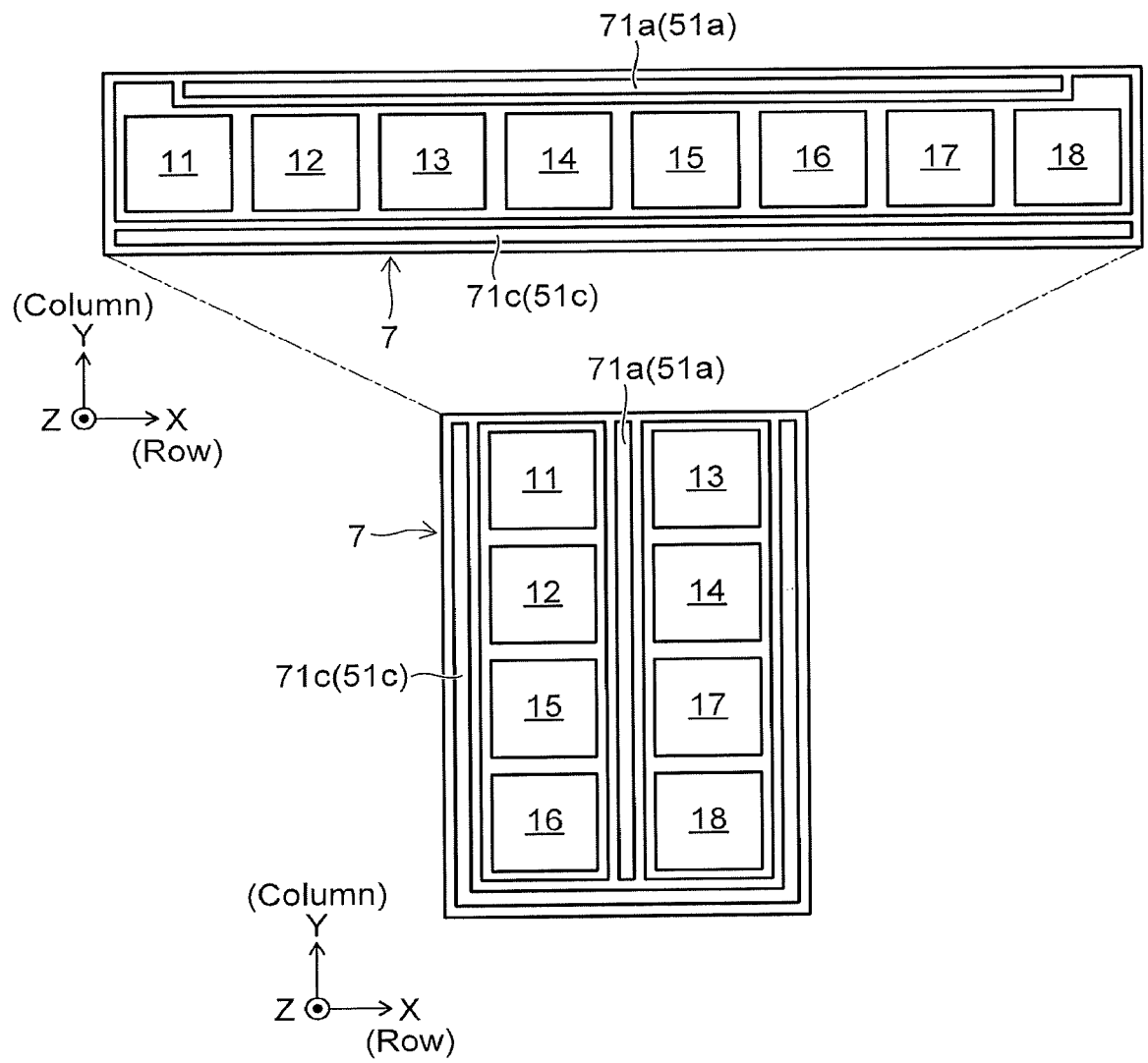
FIG. 16 is a schematic plan view illustrating an advantage point of the seventh embodiment.

FIG. 16 is a schematic view showing advantages of the seventh embodiment.

FIG. 16 shows the first to eighth semiconductor elements 11 to 18. In the case where the first to third substrate electrodes 71a (51a) to 71c (51c) are set to be common for the first to eighth semiconductor elements 11 to 18, respectively, for example, the first to eighth semiconductor elements 11 to 18 are disposed in one row and eight columns, and form a semiconductor device which is long in one direction, for example, in the X-axis direction.

On the contrary, in the seventh embodiment, the first to eighth semiconductor elements 11 to 18 can be disposed, for example, in four rows and two columns. For this reason, for example, a length in the X-axis direction can be suppressed from increasing. In the example shown in FIG. 16, the first column including the first semiconductor element 11, the second semiconductor element 12, the fifth semiconductor element 15 and the sixth semiconductor element 16, and the second column including the third semiconductor element 13, the fourth semiconductor element 14, the seventh semiconductor element 17 and the eighth semiconductor element 18 are shown.

According to the seventh embodiment, for example, the semiconductor device can be suppressed from elongating in one direction and, for example, in the power semiconductor module including multiple power semiconductor elements, the freedom of the size can be increased.

(Eighth Embodiment)

Figure 17:
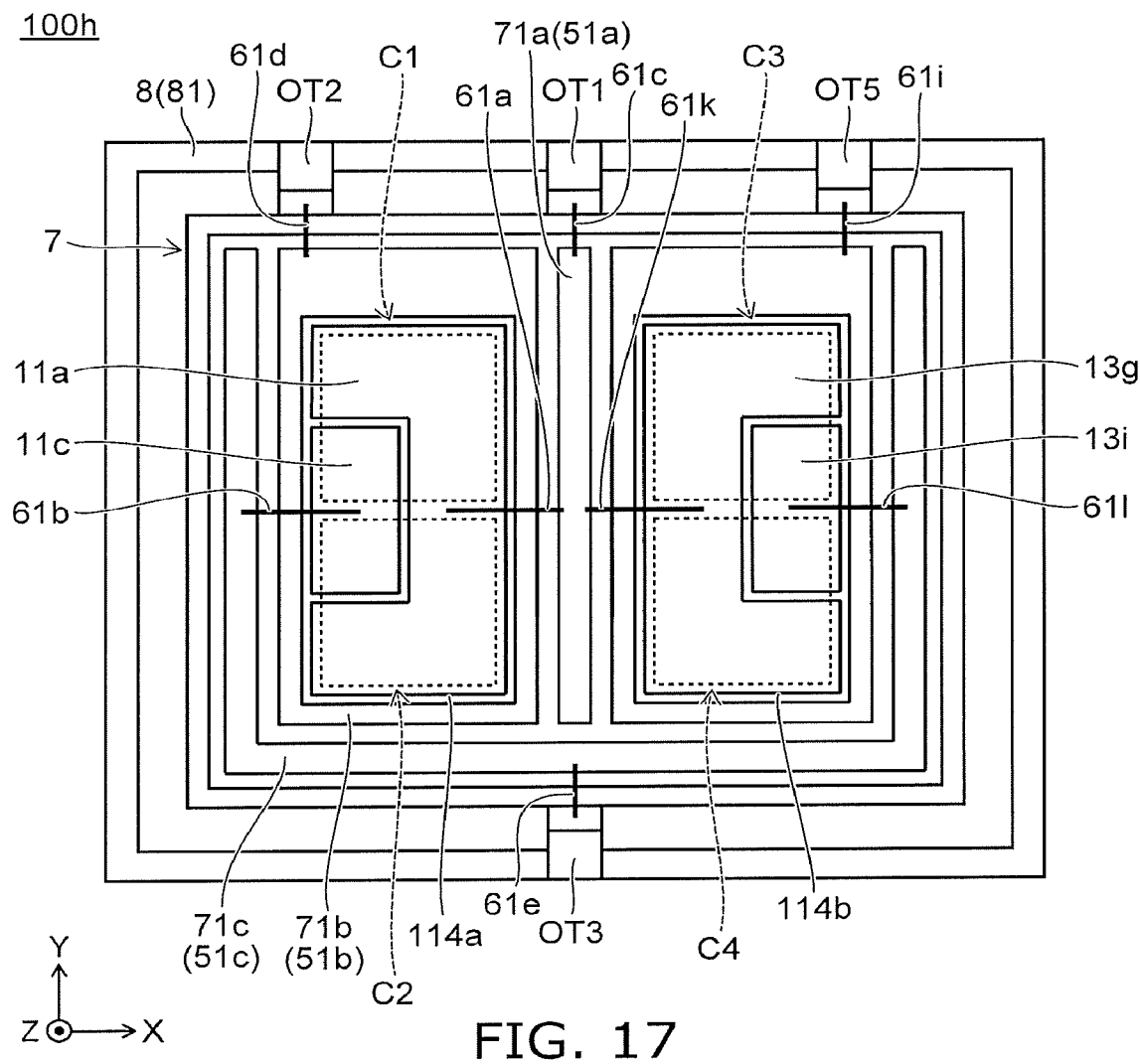
FIG. 17 is a schematic plan view illustrating a semiconductor device according to an eighth embodiment.

FIG. 17 is a schematic plan view illustrating a semiconductor device according to an eighth embodiment.

As shown in FIG. 17, a semiconductor device 100h according to the eighth embodiment includes ninth semiconductor element 114a and the tenth semiconductor element 114b. The ninth semiconductor element 114a includes, for example, the first semiconductor chip C1 and the second semiconductor chip C2 like the fourth embodiment. The tenth semiconductor element 114b also includes, for example, the third semiconductor chip C3 and the fourth semiconductor chip C4 like the fourth embodiment.

Like the eighth embodiment, for example, the seventh embodiment is possible to be implemented by combining with the fourth embodiment.

As described above, according to the embodiments, semiconductor devices and semiconductor elements which are possible to improve the yield can be provided.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in semiconductor devices of the embodiments such as first semiconductor elements, first element insulating parts, insulating dealing parts, first terminal electrodes, first wiring members, wiring substrates, case members, etc., from known art. Such practice is included in the scope of the invention to the extent that similar effects thereto are obtained. Particularly, materials or the like of the first element insulating parts and the insulating sealing parts are possible to be appropriately modified.

Further, any two or more components of the specific examples may be combined within the extent of technical feasibility and are included in the scope of the invention to the extent that the purport of the invention is included.

Moreover, all semiconductor devices practicable by an appropriate design modification by one skilled in the art based on the semiconductor devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a first semiconductor element including a first semiconductor chip and a first chip electrode electrically connected to the first semiconductor chip,
the first semiconductor chip having a first surface crossing a first direction, a second surface crossing the first direction and distant from the first surface, and a third surface positioned between the first surface and the second surface, the first chip electrode being disposed on the first surface;
a first element insulating part including a first portion and a second portion continuous to the first portion; and
an insulating sealing member including a third portion and a fourth portion continuous to the third portion,
the first portion being positioned between the first surface and the third portion, and the second portion being positioned between the third surface and the fourth portion,
a wiring substrate including an insulating substrate part, a first substrate electrode, and a second substrate electrode; and
a case member including a base part and an insulating part, the insulating part including a first external terminal,
the first semiconductor element further including a second chip electrode electrically connected to the first semiconductor chip,
the second chip electrode being disposed on the second surface,
the first substrate electrode being electrically connected to each of the first chip electrode and the first external terminal, and being positioned between the insulating sealing member and the insulating substrate part, and
the second substrate electrode being electrically connected to the second chip electrode, and being positioned between the second chip electrode and the insulating substrate part.

2. The device according to claim 1, further comprising:
a first extraction electrode electrically connected to the first chip electrode; and
a second extraction electrode electrically connected to the second chip electrode,
the first chip electrode being positioned between the first semiconductor chip and the first extraction electrode, and
the second chip electrode being positioned between the first semiconductor chip and the second extraction electrode.

3. The device according to claim 2, wherein
a thickness in the first direction of the first extraction electrode is thicker than a thickness in the first direction of the first chip electrode, and
a thickness in the first direction of the second extraction electrode is thicker than a thickness in the first direction of the second chip electrode.

4. The device according to claim 2, wherein
a length in a second direction of the first extraction electrode is longer than a length in the second direction of the first chip electrode, the second direction crossing the first direction, and a length in the second direction of the second extraction electrode is longer than a length in the second direction of the second chip electrode.

5. The device according to claim 2, wherein
the first element insulating part further includes a fifth portion, and
the fifth portion is continuous to the first portion and contacts a surface along a direction crossing the first surface of the first extraction electrode.

6. The device according to claim 2, further comprising:
a second semiconductor element including a second semiconductor chip, and a fourth chip electrode and a fifth chip electrode electrically connected to the second semiconductor chip,
the second semiconductor chip having a seventh surface crossing the first direction, an eighth surface crossing the first direction and distant from the seventh surface, and a ninth surface positioned between the seventh surface and the eighth surface, the fourth chip electrode being disposed on the seventh surface, the fifth chip electrode being disposed on the eighth surface,
the first extraction electrode being electrically connected to the fourth chip electrode,
the second extraction electrode being electrically connected to the fifth chip electrode,
the fourth chip electrode being positioned between the second semiconductor chip and the first extraction electrode,
the fifth chip electrode being positioned between the second semiconductor chip and the second extraction electrode, and
the first element insulating part further including,
a sixth portion positioned between the seventh surface and the first extraction electrode,
a seventh portion continuous to the sixth portion along the eighth surface, and
an eighth portion continuous to the sixth portion, and contacting a surface along a direction crossing the seventh surface of the first extraction electrode.

* * * * *